US008988012B2

(12) United States Patent
Yoshikawa et al.

(10) Patent No.: US 8,988,012 B2
(45) Date of Patent: Mar. 24, 2015

(54) DIELECTRIC WINDOW FOR PLASMA PROCESSING APPARATUS, PLASMA PROCESSING APPARATUS AND METHOD FOR MOUNTING DIELECTRIC WINDOW FOR PLASMA PROCESSING APPARATUS

(75) Inventors: Wataru Yoshikawa, Miyagi (JP); Naoki Matsumoto, Miyagi (JP); Jun Yoshikawa, Hyogo (JP)

(73) Assignee: Tokyo Electron Limited, Minato-Ku, Tokyo ( * ) Notice: Subject to any disclaimer, the term of this patent is extended or adjusted under 35 U.S.C. 154(b) by 31 days.

(21) Appl. No.: 13/638,345

(22) PCT Filed: Mar. 24, 2011

(86) PCT No.: PCT/JP2011/057229
§ 371 (c)(1),
(2), (4) Date: Dec. 7, 2012

(87) PCT Pub. No.: WO2011/125524
PCT Pub. Date: Oct. 13, 2011

(65) Prior Publication Data
US 2013/0093321 A1    Apr. 18, 2013

(30) Foreign Application Priority Data
Mar. 31, 2010   (JP) .................................. 2010-082169

(51) Int. Cl.
*H01J 7/46* (2006.01)
*H01J 23/36* (2006.01)
(Continued)

(52) U.S. Cl.
CPC .......... *H01J 23/36* (2013.01); *H01J 37/32192* (2013.01); *H01J 37/32238* (2013.01); *H01J 9/44* (2013.01)
USPC .... 315/309; 315/39; 315/111.21; 315/111.91

(58) Field of Classification Search
CPC ........................... H01J 37/32357; H01J 23/02
USPC ............... 315/31, 111.21, 111.41, 111.81, 39
See application file for complete search history.

(56) References Cited

U.S. PATENT DOCUMENTS 4,965,541 A * 10/1990 Okazaki ........................ 333/252
5,132,652 A *  7/1992 Doehler et al. ............... 333/252
(Continued)

FOREIGN PATENT DOCUMENTS

| JP | 2008-182102 | 8/2008 |
| JP | 2009-099807 | 5/2009 |

(Continued)

OTHER PUBLICATIONS

International Preliminary Report on Patentability and Written Opinion of the International Search Authority mailed Nov. 13, 2012 and Jun. 21, 2011.

(Continued)

*Primary Examiner* — Douglas W Owens
*Assistant Examiner* — Srinivas Sathiraju
(74) *Attorney, Agent, or Firm* — Brundidge & Stanger, P.C.

(57) ABSTRACT

In a dielectric window 41 for a plasma processing apparatus, a first dielectric window recess 47 is formed on an outer region of a surface of the dielectric window 41 in a diametrical direction of the dielectric window 41 at a side where plasma is generated, and the first dielectric window recess 47 is extended in a ring shape and has a tapered shape inwardly in a thickness direction of the dielectric window 41. A multiple number of second dielectric window recesses 53a to 53g are formed between the center of the dielectric window 41 and the first dielectric window recess 47, and each of the second dielectric window recesses 53a to 53g is recessed inwardly in the thickness direction of the dielectric window 41 from the surface of the dielectric window 41.

15 Claims, 13 Drawing Sheets

(51) Int. Cl.
*H01J 37/32* (2006.01)
*H01J 9/44* (2006.01)

(56) References Cited

U.S. PATENT DOCUMENTS

| | | | |
|---|---|---|---|
| 6,361,707 B1* | 3/2002 | Tanaka et al. | 216/69 |
| 6,632,324 B2* | 10/2003 | Chan | 156/345.48 |
| 7,732,759 B2* | 6/2010 | Chen et al. | 250/251 |
| 2008/0105650 A1* | 5/2008 | Sugai et al. | 216/69 |
| 2009/0130335 A1* | 5/2009 | Okumura et al. | 427/569 |
| 2010/0214043 A1* | 8/2010 | Courtney et al. | 333/252 |
| 2011/0000780 A1 | 1/2011 | Tian et al. | |
| 2011/0048642 A1* | 3/2011 | Mihara et al. | 156/345.34 |

FOREIGN PATENT DOCUMENTS

| | | |
|---|---|---|
| JP | 2009-206192 | 9/2009 |
| JP | 2009-212085 | 9/2009 |
| JP | 2010-232493 | 10/2010 |
| WO | 2009/101927 | 8/2009 |

OTHER PUBLICATIONS

International Search Report from International Application No. PCT/JP2011/057229 mailed Jun. 21, 2011.

* cited by examiner

_US 8,988,012 B2_

DIELECTRIC WINDOW FOR PLASMA PROCESSING APPARATUS, PLASMA PROCESSING APPARATUS AND METHOD FOR MOUNTING DIELECTRIC WINDOW FOR PLASMA PROCESSING APPARATUS

CROSS-REFERENCE TO RELATED APPLICATION

This Application is a U.S. national phase application under 35 U.S.C. §371 of PCT Application No. PCT/JP2011/057229 filed on Mar. 24, 2011, which claims the benefit of Japanese Patent Application No. 2010-082169 filed on Mar. 31, 2010, the entire disclosures of which are incorporated herein by reference.

TECHNICAL FIELD

The present disclosure relates a dielectric window for use in a plasma processing apparatus (hereinafter, simply referred to as a "dielectric window"), a plasma processing apparatus and a method for mounting the dielectric window. Particularly, the present disclosure relates to a dielectric window that transmits microwave and has a substantially circular plate shape. Also, the present disclosure relates to a plasma processing apparatus having the dielectric window and a method for mounting the dielectric window.

BACKGROUND ART

A semiconductor device such as an LSI (Large Scale Integrated circuit) or a MOS (Metal Oxide Semiconductor) transistor is manufactured by performing various processes such as etching, CVD (Chemical Vapor Deposition) and sputtering on a semiconductor substrate (wafer) as a processing target substrate. A processing method using plasma as an energy source, i.e., plasma etching, plasma CVD or plasma sputtering may be used to perform the etching, the CVD or the sputtering process.

Here, a microwave plasma processing apparatus using microwave to generate plasma is described in WO2009/101927A1 (Patent Document 1). In this microwave plasma processing apparatus of Patent Document 1, a ceiling plate (dielectric window) that transmits microwave is provided. In order to uniformly transmit microwave in a circumferential direction of the ceiling plate, a recess is formed on a surface of the ceiling plate (dielectric window) at the side where plasma is generated. The recess resonantly absorbs the microwave at side surfaces thereof and allows the microwave to propagate therein in a single mode.

Patent Document 1: WO2009/101927A1

DISCLOSURE OF THE INVENTION

Problems to be Solved by the Invention

In a plasma processing apparatus, a plasma process is performed under various processing conditions depending on the process type or characteristics required for a processing target substrate. Here, in the plasma processing apparatus, a wide range of process margin and high axial symmetry of generated plasma are required. The term "process margin" refers to a range of processing conditions in which plasma can be stably generated and a plasma process can be successfully performed even when processing conditions for the plasma processing apparatus are changed. Such processing conditions may include an internal pressure of a processing chamber of the plasma processing apparatus, microwave power, a kind of a gas, and partial pressure of each of gases or a flow rate ratio between the gases when plural kinds of gases are used. It is desirable that the process margin is as large as possible. Further, in a plasma process, it is desirable that the processing degree is uniform within the entire surface of the processing target substrate. By way of example, it is desirable to prevent the non-uniformity of the processing on the processing target substrate in a circumferential direction thereof. In order to uniformly perform the process on the processing target substrate, the generated plasma is required to have high axial symmetry. That is, the plasma needs to have high symmetry with respect to a central axis of the dielectric window or a slot antenna plate.

However, in the configuration of the plasma processing apparatus described in Patent Document 1 and in the configuration of a conventional plasma processing apparatus having a flat dielectric window, the requirement for the wide range of process margin and the requirement for the plasma uniformity could not be satisfied. In such circumstances, a multiple number of slot antenna plates having different numbers of slots may be provided, and whenever there is a change in the processing conditions, the slot antenna plates may be replaced. However, it is troublesome to replace the slot antenna plates whenever the processing conditions are changed. Further, since the slot antenna plates having different shapes need to be provided, the conventional apparatuses have a disadvantage in cost.

In view of the foregoing problem, illustrative embodiments provide a dielectric window for use in a plasma processing apparatus, having a wide range of process margin and allowing high axial symmetry of plasma generated in the plasma processing apparatus.

Further, illustrative embodiments also provide a plasma processing apparatus having a wide range of process margin and capable of improving processing uniformity.

In addition, illustrative embodiments also provide a method for mounting a dielectric window for use in a plasma processing apparatus, having a wide range of process margin and allowing high axial symmetry of plasma generated in the plasma processing apparatus. Through this method, the dielectric window can be easily mounted in the plasma processing apparatus.

Means for Solving the Problems

In accordance with one aspect of an illustrative embodiment, there is provided a dielectric window for a plasma processing apparatus. The dielectric window is provided in the plasma processing apparatus using microwave as a plasma source, and has a substantially circular plate shape and propagates the microwave. A first dielectric window recess is formed on an outer region of a surface of the dielectric window in a diametrical direction of the dielectric window at a side where plasma is generated when the dielectric window is mounted in the plasma processing apparatus, and the first dielectric window recess is extended in a ring shape and has a tapered shape inwardly in a thickness direction of the dielectric window. Further, a multiple number of second dielectric window recesses are formed between a center of the dielectric window and the first dielectric window recess, and each of the second dielectric window recess is recessed inwardly in the thickness direction of the dielectric window from the surface of the dielectric window. Moreover, the second dielectric window recesses are arranged at a regular interval in a circumferential direction of the dielectric window to have rotation symmetry about the center of the dielectric window in the diametrical direction thereof.

With this configuration, by providing the ring-shaped first dielectric window recess having the tapered shape, there is formed, on the outer region of the dielectric window in the diametrical direction, a region where the thickness of the dielectric window varies continuously. Accordingly, there can be formed a resonance region where dielectric window has a thickness suitable for various processing conditions for plasma generation. With this configuration, under various processing conditions, high stability of plasma can be obtained on the outer region in the diametrical direction. Further, by providing the second dielectric window recesses, a mode locking can be firmly performed in the inner region of the dielectric window in the diametrical direction. In such a case, even if processing conditions are varied in wide variety, a firmly mode-locked region can be formed in the inner region of the dielectric window in the diametrical direction. Since the multiple number of second dielectric window recesses have rotation symmetry, the firmly mode-locked region can also have high axial symmetry in the inner region of the dielectric window in the diametrical direction. Thus, generated plasma also has high axial symmetry. Accordingly, the dielectric window for the plasma processing apparatus with this configuration has a wide range of process margin and the generated plasma has high axial symmetry.

Desirably, the second dielectric window recess may be recessed inwardly and straightly in the thickness direction of the dielectric window from the surface of the dielectric window at the side where plasma is generated.

Desirably, the second dielectric window recess may have a circular hole shape when viewed from the thickness direction of the dielectric window.

Desirably, when viewed from the thickness direction of the dielectric window, centers of the second dielectric window recesses, each having the circular hole shape, may be arranged on a circle centered about the center of the dielectric window in the diametrical direction thereof.

Further, the dielectric window may further include a position adjusting device configured to adjust a position of the dielectric window in the circumferential direction of the dielectric window when the dielectric window is mounted in the plasma processing apparatus.

Desirably, the position adjusting device may include dielectric window graduations provided between the first dielectric window recess and an edge portion of the dielectric window.

In accordance with another aspect of an illustrative embodiment, there is provided a plasma processing apparatus using microwave as a plasma source. The plasma processing apparatus includes a dielectric window for the plasma processing apparatus, and the dielectric window has a substantially circular plate shape and propagates the microwave. A first dielectric window recess is formed on an outer region of a surface of the dielectric window in a diametrical direction of the dielectric window at a side where plasma is generated when the dielectric window is mounted in the plasma processing apparatus, and the first dielectric window recess is extended in a ring shape and has a tapered shape inwardly in a thickness direction of the dielectric window. Further, a multiple number of second dielectric window recesses are formed between the center of the dielectric window and the first dielectric window recess, and each of the second dielectric window recesses is recessed inwardly in the thickness direction of the dielectric window from the surface of the dielectric window. Moreover, the second dielectric window recesses are arranged at a regular interval in a circumferential direction of the dielectric window to have rotation symmetry about the center of the dielectric window in the diametrical direction thereof.

In accordance with the plasma processing apparatus of the illustrative embodiment, a wide range of process margin can be obtained and processing uniformity can be improved.

Desirably, the plasma processing apparatus may further include a substantially circular plate-shaped slot antenna plate. The slot antenna plate may have a multiple number of slots formed through the slot antenna plate in a thickness direction of the slot antenna plate, and be disposed above the dielectric window and be configured to radiate the microwave toward the dielectric window.

The slot antenna plate may have a multiple number of slot pairs each having a first slot located at a central portion of the slot antenna plate and extended in one direction and a second slot extended in a direction orthogonal to the one direction. Further, at least a part of the first slot may be overlapped with the second dielectric window recess.

Further, the slot antenna plate may have a multiple number of slot pairs each having a first slot extended in one direction and a second slot extended in a direction orthogonal to the one direction. Further, when viewed from the thickness direction of the slot antenna plate, the second dielectric window recess may be located in a region where a region having a width equal to a long side of the first slot of the slot antenna plate and a region having a width equal to a long side of the second slot thereof are overlapped.

Further, the slot antenna plate may have a multiple number of slot pairs each having a first slot extended in one direction and a second slot extended in a direction orthogonal to the one direction. Further, each of the slot pairs may be located at a position corresponding to a position where each of the second dielectric window recesses is formed.

Desirably, the plasma processing apparatus may further include a position adjusting device configured to adjust a position of the dielectric window in the circumferential direction of the dielectric window when the dielectric window is mounted in the plasma processing apparatus. The position adjusting device may be also configured to adjust a relative position between the dielectric window and the slot antenna plate in the circumferential direction thereof.

Further, a ratio of a short side length of the slot to a long side length thereof may be equal to or larger than about ¼ and smaller than about 1.

In accordance with still another aspect of an illustrative embodiment, there is provided a method for mounting a dielectric window for a plasma processing apparatus in the plasma processing apparatus using microwave as a plasma source, and the dielectric window has a substantially circular plate shape and propagates the microwave. In the dielectric window, a first dielectric window recess is formed on an outer region of a surface of the dielectric window in a diametrical direction of the dielectric window at a side where plasma is generated when the dielectric window is mounted in the plasma processing apparatus, and the first dielectric window recess is extended in a ring shape and has a tapered shape inwardly in a thickness direction of the dielectric window. Further, a multiple number of second dielectric window recesses are formed between the center of the dielectric window and the first dielectric window recess, and each of the second dielectric window recesses is recessed inwardly in the thickness direction of the dielectric window from the surface of the dielectric window. Moreover, the second dielectric window recesses are arranged at a regular interval in a circumferential direction of the dielectric window to have rotation symmetry about the center of the dielectric window in the diametrical direction thereof. The plasma processing apparatus includes a substantially circular plate-shaped slot antenna plate, and the slot antenna plate has a multiple number of slots formed through the slot antenna plate in a thickness direction thereof, and the slot antenna plate is disposed above the dielectric window and radiates the microwave toward the dielectric window. The method includes adjusting a positional relationship between the second dielectric window recesses of the dielectric window and the slots of the slot antenna plate in the circumferential direction when mounting the dielectric window in the plasma processing apparatus.

In accordance with the method for mounting the dielectric window for the plasma processing apparatus of the illustrative embodiment, it is possible to mount the dielectric window in the plasma processing apparatus while adjusting the position of the dielectric window in the circumferential direction more easily.

Desirably, dielectric window graduations for adjusting a position of the dielectric window in the circumferential direction thereof may be provided at the dielectric window, and a mark as a reference for a position in the circumferential direction of the slot antenna plate may be provided at the slot antenna plate. Further, the positional relationship between the dielectric window and the slot antenna plate in the circumferential direction may be adjusted by using the dielectric window graduations and the mark.

Effect of the Invention

In accordance with a dielectric window for a plasma processing apparatus of an illustrative embodiment, by providing a ring-shaped first dielectric window recess having the tapered shape, there is formed, on an outer region of the dielectric window in a diametrical direction, a region where a thickness of the dielectric window varies continuously. Accordingly, there can be formed a resonance region where the dielectric window has a thickness suitable for various processing conditions for plasma generation. With this configuration, under various processing conditions, high stability of plasma can be obtained on the outer region in the diametrical direction. Further, by providing second dielectric window recesses, a mode locking can be firmly performed in the inner region of the dielectric window in the diametrical direction. In such a case, even if processing conditions are varied in wide variety, a firmly mode-locked region can be formed in the inner region of the dielectric window in the diametrical direction. Since the second dielectric window recesses have rotation symmetry, the firmly mode-locked region can also have high axial symmetry in the inner region of the dielectric window in the diametrical direction. Thus, generated plasma also has high axial symmetry. Accordingly, the dielectric window for the plasma processing apparatus with this configuration has a wide range of process margin and the generated plasma has high axial symmetry.

Further, in accordance with the plasma processing apparatus of the illustrative embodiment, a wide range of process margin can be obtained and processing uniformity can be improved.

In addition, in accordance with the method for mounting the dielectric window for the plasma processing apparatus of the illustrative embodiment, it is possible to mount the dielectric window for the plasma processing apparatus in the plasma processing apparatus while adjusting the position of the dielectric window in the circumferential direction more easily.

BEST MODE FOR CARRYING OUT THE INVENTION

Figure 1:
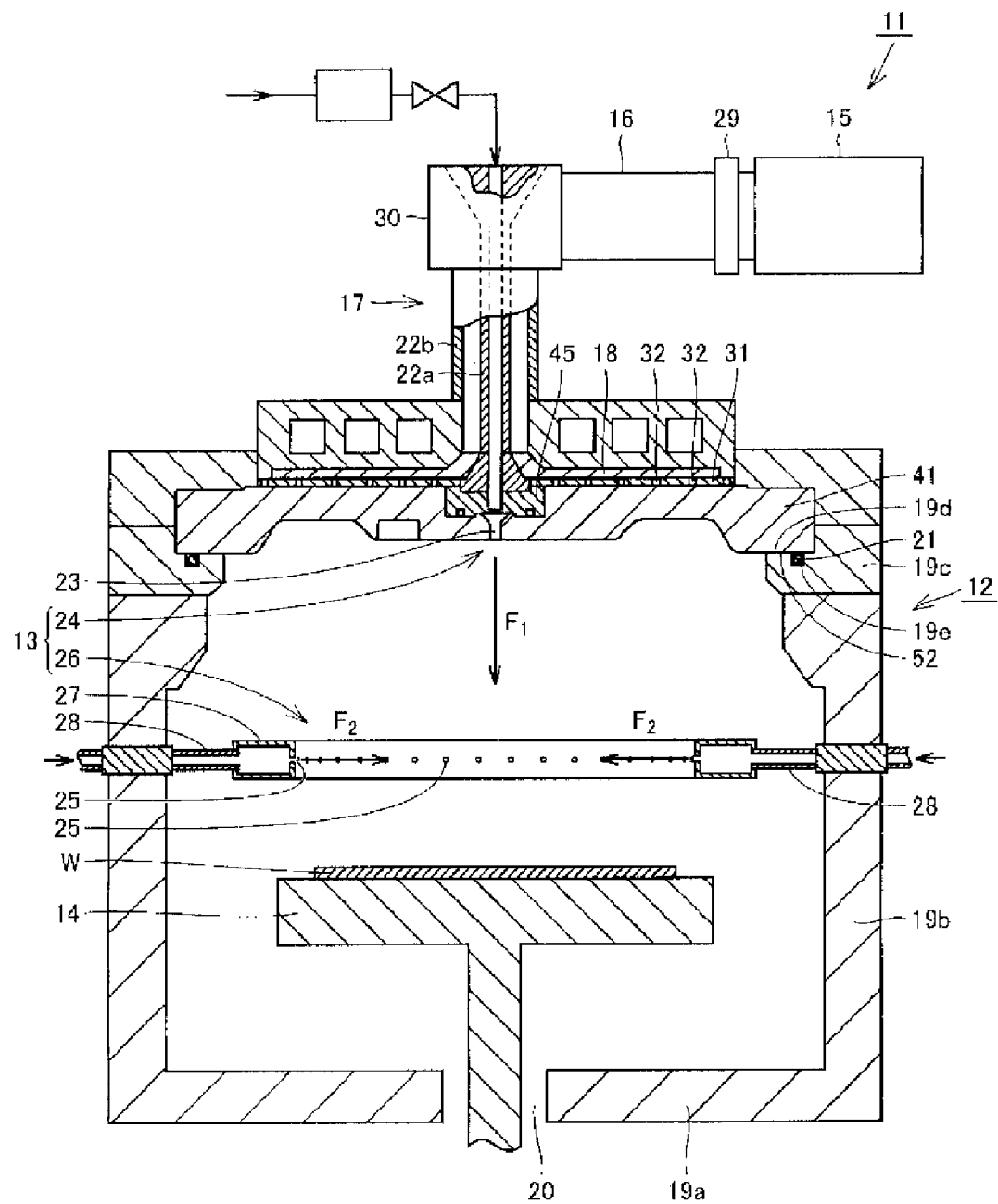
FIG. 1 is a cross sectional view schematically illustrating a configuration of a plasma processing apparatus in accordance with an illustrative embodiment.
Figure 2:
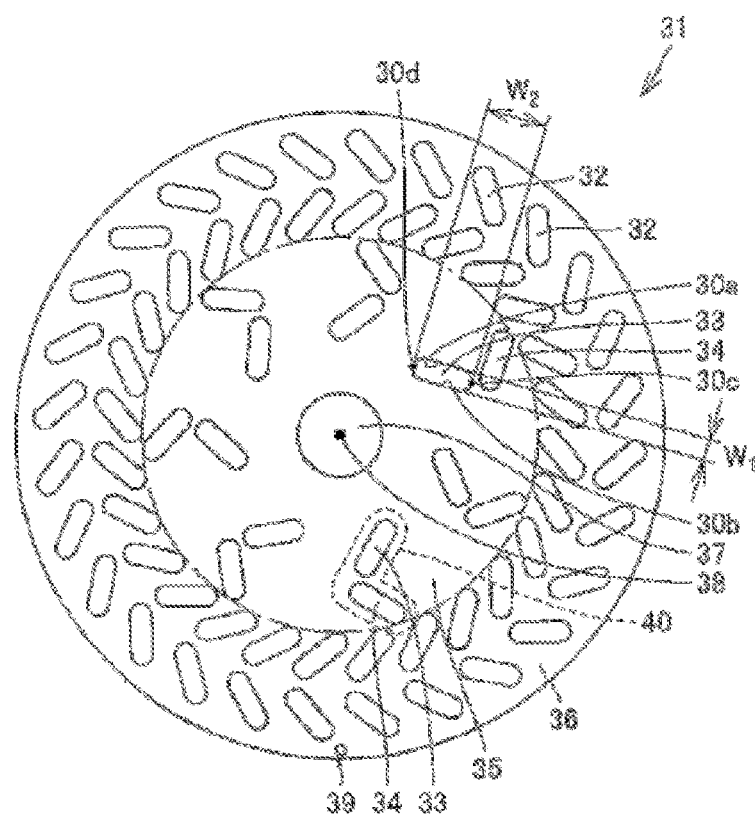
FIG. 2 is a diagram showing a slot antenna plate provided in the plasma processing apparatus in accordance with the illustrative embodiment, when viewed from a thickness direction of the slot antenna plate.

Hereinafter, illustrative embodiments will be described in detail with reference to the accompanying drawings. First, a configuration of a plasma processing apparatus in accordance with an illustrative embodiment will be explained. FIG. 1 is a cross sectional view schematically illustrating a configuration of a plasma processing apparatus in accordance with an illustrative embodiment. FIG. 2 is a diagram showing a slot antenna plate provided in the plasma processing apparatus shown in FIG. 1, when viewed from a thickness direction of the slot antenna plate.

Referring to FIGS. 1 and 2, a plasma processing apparatus 11 in accordance with the illustrative embodiment is configured as a microwave plasma processing apparatus that uses microwave as a plasma source. The plasma processing apparatus 11 includes a processing chamber 12, a gas supply unit 13, a holding table 14, a microwave generator 15, a waveguide 16, a coaxial waveguide 17, a dielectric plate 18, a slot antenna plate 31, a dielectric window 41 and a controller (not shown). The processing chamber 12 has therein a processing space in which a plasma process is performed on a processing target substrate W. The gas supply unit 13 supplies, e.g., a gas for the plasma process into the processing chamber 12. The holding table 14 is disposed within the processing chamber 12 and holds thereon the processing target substrate W. The microwave generator 15 is disposed outside the processing chamber 12 and generates microwave for plasma excitation. The waveguide 16 and the coaxial waveguide 17 introduce the microwave generated by the microwave generator 15 into the processing chamber 12. The dielectric plate 18 is connected to a lower end of the coaxial waveguide 17 and propagates the microwave introduced through the coaxial waveguide 17 in a diametrical direction thereof. The slot antenna plate 31 is provided under the dielectric plate 18 and has a multiple number of slots 32 for radiating the microwave propagated by the dielectric plate 18. The dielectric window 41 is provided under the slot antenna plate 31, and serves to propagate the microwave radiated through the slots 32 in a diametrical direction and transmit the microwave into the processing chamber 12. The controller controls overall operations of the plasma processing apparatus 11. The controller also controls processing conditions for performing the plasma process on the processing target substrate W, such as a gas flow rate of the gas supply unit 13 and an internal pressure of the processing chamber 12. In FIG. 1, opening shapes of the slots 32 are schematically depicted to facilitate easy understanding.

The processing chamber 12 includes a bottom 19a positioned under the holding table 14; a sidewall 19b extending upwards from a periphery of the bottom 19a; and an annular member 19c mounted on top of the sidewall 19b and on which the dielectric window 41 is mounted. The sidewall 19b is of a cylindrical shape. An exhaust hole 20 for gas exhaust is formed in a central portion of the bottom 19a of the processing chamber 12 in a diametrical direction thereof. A top portion of the processing chamber 12 is opened, and the processing chamber 12 is configured to be hermetically sealed by the dielectric window 41 provided at the top portion of the processing chamber 12 and an O-ring 21 serving as a seal member. The O-ring 21 is provided between the dielectric window 41 and the processing chamber 12, specifically, between the dielectric window 41 and the annular member 19c as a part of the processing chamber 12.

The holding table 14 is electrically connected to a high frequency power supply for a RF (Radio Frequency) bias via a matching unit and a power supply rod (both are not shown). The high frequency power supply applies a high frequency power of a certain frequency, e.g., about 13.56 MHz, for controlling energy of ions attracted into the processing target substrate W at a preset power level. The matching unit includes a matching device for matching impedance on a side of the high frequency power supply and impedance on a load side such as the electrode, the plasma and the processing chamber 12. The matching device includes a blocking capacitor.

The gas supply unit 13 includes a central gas supply unit 24 having a gas supply opening 23 for supplying a gas toward a central portion of the processing target substrate W; and an outer gas supply unit 26 constituted by a circular ring-shaped hollow member 27 and having gas supply openings 25 for supplying a gas inwardly in a diametrical direction of the processing chamber 12.

The gas supply opening 23 of the central gas supply unit 24 is formed through a central portion of the circular plate-shaped dielectric window 41 in a diametrical direction thereof. A hollow portion of a hollow central conductor 22a of the coaxial waveguide 17 serves as a gas supply path of the central gas supply unit 24. The central gas supply unit also includes an injector 45 accommodated in the dielectric window 41 and configured to discharge a gas into the processing chamber 12.

The hollow member 27 of the outer gas supply unit 26 are supported by a multiple number of supporting members 28 straightly extended from an inner surface of the sidewall 19b of the processing chamber 12 in the diametrical direction thereof. An inner diameter of the hollow member is set to be larger than an outer diameter of the processing target substrate W. A hollow portion of the hollow member 27 has a substantially rectangular cross section. The hollow member 27 is placed above the holding table 14, without being overlapped with a region directly above the processing target substrate W. The gas supply openings 25 of the outer gas supply unit 26 are formed in the inner wall surface of the circular ring-shaped hollow member 27. Each of the gas supply openings 25 has a circular hole shape and the gas supply openings 25 are uniformly arranged while spaced apart from each other at a regular interval.

Each of the central gas supply unit 24 and the outer gas supply unit 26 is configured to supply a gas for a plasma process or the like into the processing chamber 12 from the outside thereof. Flow directions of the gases supplied from the gas supply opening 23 and the gas supply openings 25 are indicated by arrows $F_1$ and $F_2$, respectively. Further, the kinds of the gases supplied from the central gas supply unit 24 and the outer gas supply unit 26 and a flow rate ratio between the gases may be selected in various ways. By way of example, different kinds of gases may be supplied from the central gas supply unit 24 and the outer gas supply unit 26, respectively, or a gas may be supplied into the processing chamber 12 only from the outer gas supply unit 26 without being supplied from the central gas supply unit 24. Further, by allowing the gas supply unit 13 to include the central gas supply unit 24 and the outer gas supply unit 26, processing uniformity in the diametrical direction can be finely adjusted. To elaborate, when an end region of the processing target substrate W may be insufficiently processed as compared to a central region thereof, a flow rate of the gas supplied from the outer gas supply unit 26 may be increased in the flow rate ratio between the gases supplied from the central gas supply unit 24 and the outer gas supply unit 26. Accordingly, a plasma process at the end region of the processing target substrate can be accelerated, so that the processing uniformity can be finely adjusted.

The microwave generator 15 having a tuner 29 is connected to an upstream side of the waveguide 16 for introducing microwave via the coaxial waveguide 17 and a mode converter 30. The coaxial waveguide 17 includes the central conductor 22a and an outer conductor 22b both of which have cylindrical shapes. Centers of the central conductor 22a and the outer conductor 22b in their diametrical directions are identical to each other. Further, the central conductor 22a and the outer conductor 22b are extended in a vertical direction of FIG. 3 with a gap maintained between an outer surface of the central conductor 22a and an inner surface of the outer conductor 22b. By way of example, microwave of a TE mode generated by the microwave generator 15 is converted into a TEM mode by the mode converter 30 after passing through the waveguide 16 and then is propagated in the coaxial waveguide 17. A frequency of the microwave generated by the microwave generator 15 may be set to be, e.g., about 2.45 GHz.

Here, a specific configuration of the slot antenna plate 31 will be discussed. The slot antenna plate 31 has a thin circular plate shape. Two opposite surfaces of the slot antenna plate 31 in a thickness direction thereof are both flat. A multiple number of slots 32 are formed through the slot antenna plate 31 in the thickness direction thereof. The slots 32 include first slots 33 and second slots 34, and each of the first slots 33 and each of the second slots 34 make a pair. Here, the first slot 33 is elongated in one direction and the second slot 34 is elongated in a direction orthogonal to the elongated direction of the first slot 33. To elaborate, every two adjacent slots 33 and 34 make a pair and are arranged in a substantially L shape with a cut-off center. That is, the slot antenna plate 31 has slot pairs 40, each having the first slot 33 elongated in the one direction and the second slot 34 elongated in a direction orthogonal to the elongated direction of the first slot 33. An example slot pair 40 is indicated by a dashed line in FIG. 2.

In accordance with the present illustrative embodiment, an opening width of the first slot 33, i.e., a length $W_1$ between one wall portion 30a extended in a lengthwise direction of the first slot 33 and the other wall portion 30b extended in the lengthwise direction of the first slot 33 is set to be, e.g., about 12 mm. Meanwhile, a length of the first slot 33, i.e., a length $W_2$ between one end portion 30c in the lengthwise direction of the first slot 33 and the other end portion 30d in the lengthwise direction of the first slot 33 is set to be, e.g., about 50 mm. As for the first slot 33, a ratio ($W_1/W_2$) of the short side length to the long side length is set to be, e.g., about 12/50, i.e., about ¼. The second slot 34 has the same opening shape and size as those of the first slot 33. That is, if the first slot 33 is rotated about 90 degrees, the second slot 34 is completely overlapped with the rotated first slot 33. Further, when a long hole such as a slot is formed, the length ratio ($W_1/W_2$) is set to be smaller than a value of about 1.

The slot pairs 40 are divided into an inner slot pair group 35 arranged in an inner region of the slot antenna plate and an outer slot pair group 36 arranged in an outer region of the slot antenna plate. The inner slot pair group includes seven slot pairs 40 positioned inside an imaginary circle indicated by a dashed-dotted line in FIG. 2. The outer slot pair group 36 includes twenty eight slot pairs 40 positioned outside the imaginary circle indicated by the dashed-dotted line in FIG. 2. As for the inner slot pair group 35, the seven slot pairs 40 are arranged at a regular interval in a circumferential direction of the slot antenna plate. With this configuration, each of the seven slot pairs 40 belonging to the inner slot pair group 35 can be arranged at a position corresponding to a position of second dielectric window recesses of the dielectric window to be described later. As for the outer slot pair group 36, the twenty eight slot pairs 40 are arranged at a regular interval in the circumferential direction of the slot antenna plate. A through hole 37 is also formed at the center of the slot antenna plate 31 in a diametrical direction thereof.

A reference hole 39 is formed through the slot antenna plate 31 in the thickness direction thereof at a region between the outer slot pair group 36 and an edge portion of the slot antenna plate 31. The reference hole 39 allows the slot antenna plate 31 to be easily positioned in the circumferential direction thereof. With the reference hole 39 as a mark, the position of the slot antenna plate 31 in the circumferential direction is determined with respect to the processing chamber 12 or the dielectric window 41. The slot antenna plate 31 has rotation symmetry about a center 38 of the slot antenna plate 31 in the diametrical direction, except for the reference hole 39.

Microwave generated by the microwave generator 15 is propagated to the dielectric plate 18 through the coaxial waveguide 17, and then, radiated to the dielectric window 41 through the slots 32 of the slot antenna plate 31. The microwave transmitted through the dielectric window 41 generates an electric field directly under the dielectric window 41 and generates plasma within the processing chamber 12. The plasma generated directly under the dielectric window 41 is diffused in a direction away from the dielectric window 41, i.e., toward the holding table 14. In a plasma diffusion region defined by the diffused plasma and including the processing target substrate mounted on the holding table 14, a plasma process such as a plasma etching process is performed on the processing target substrate W. The microwave plasma provided for the process in the plasma processing apparatus 11 is generated by a radial line slot antenna (RLSA: Radial Line Slot Antenna) including the slot antenna plate 31 and the dielectric window 41.

Figure 3:
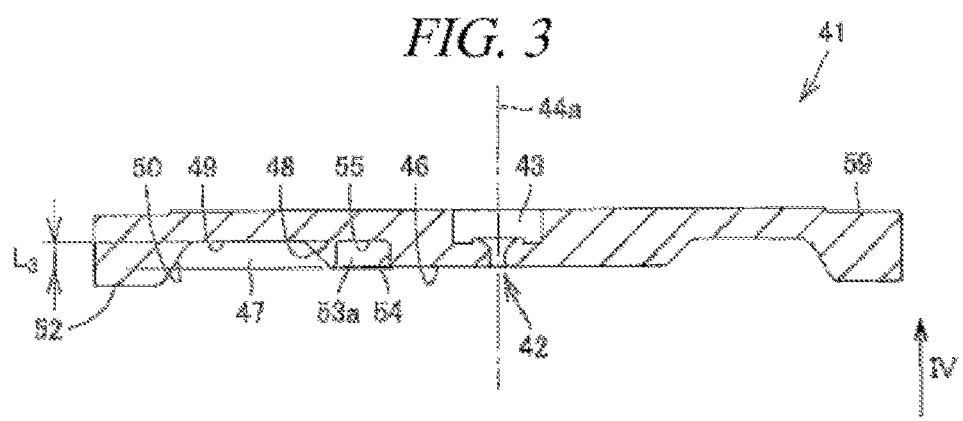
FIG. 3 is a cross sectional view of a dielectric window provided in the plasma processing apparatus of FIG. 1.
Figure 4:
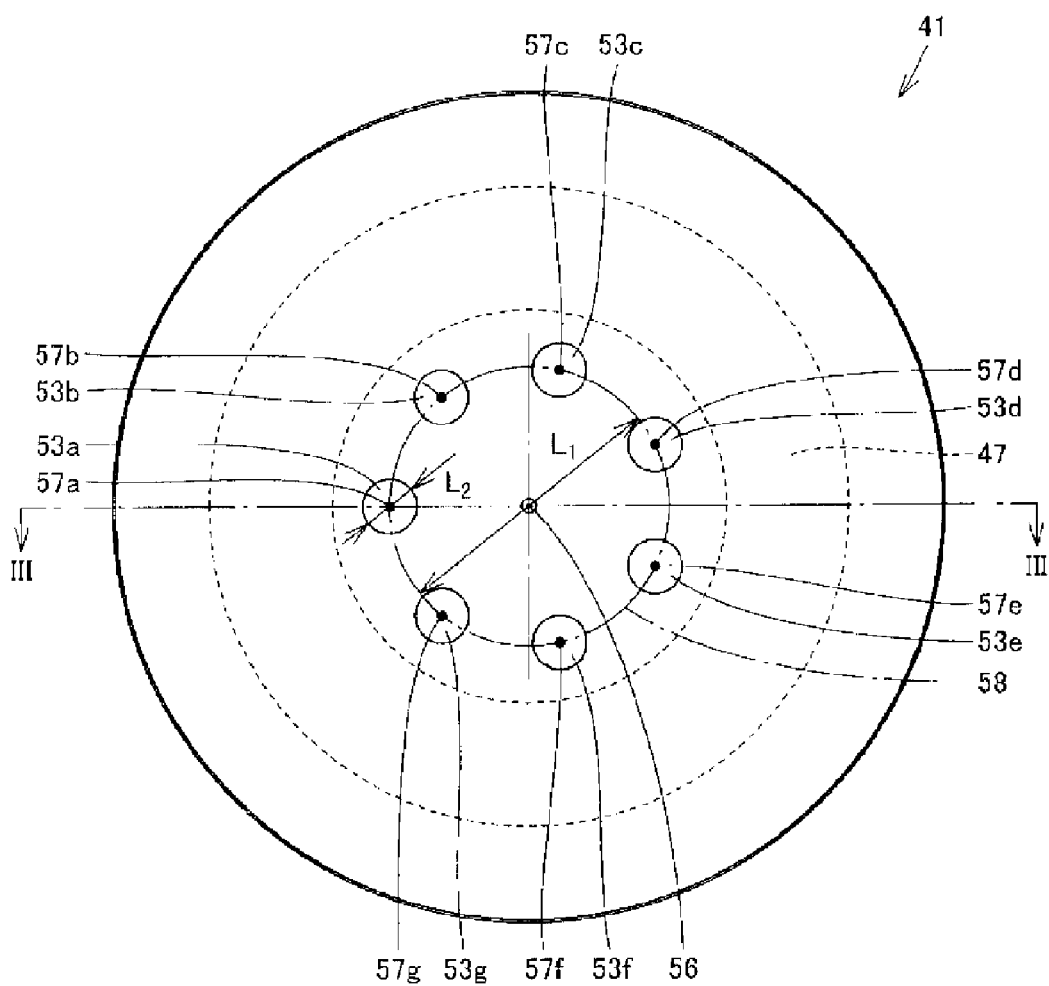
FIG. 4 is a diagram showing the dielectric window of FIG. 3, when viewed from a direction of an arrow IV of FIG. 3.
Figure 5:
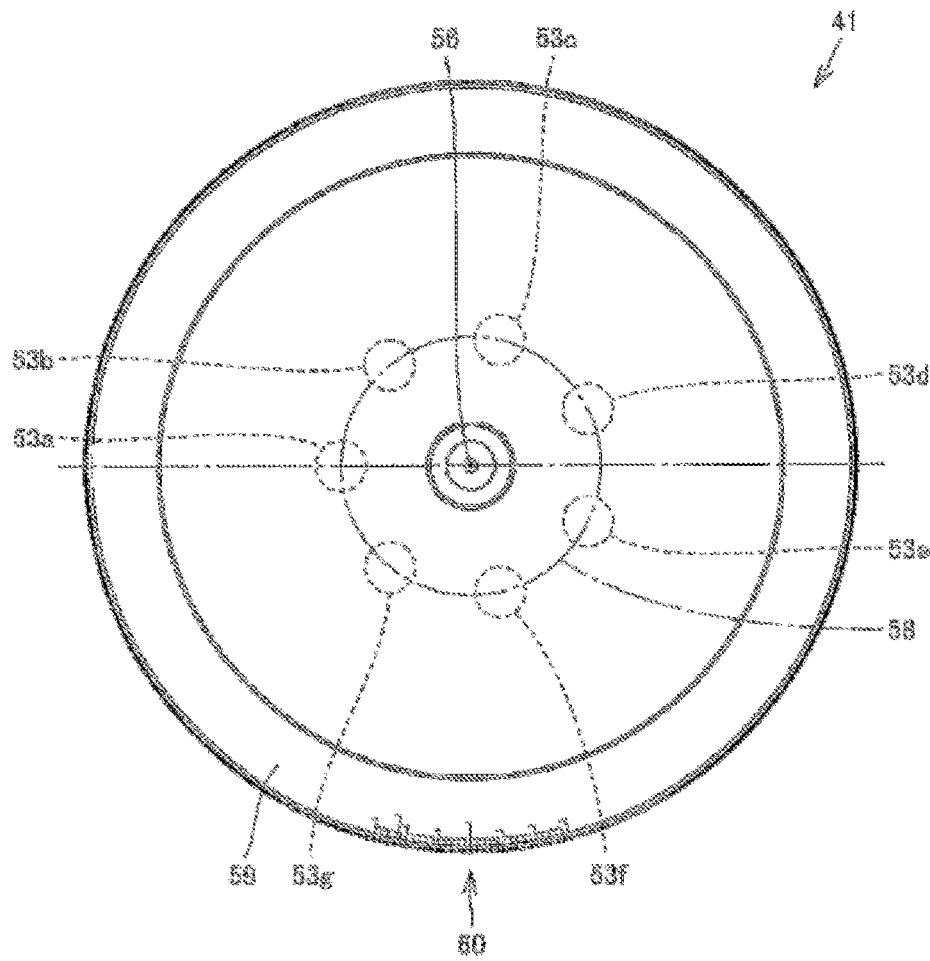
FIG. 5 is a diagram showing the dielectric window of FIG. 3, when viewed from a direction opposite to the direction of the arrow IV of FIG. 3.
Figure 6:
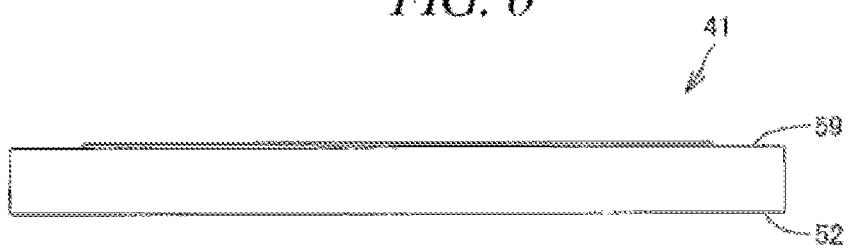
FIG. 6 is a side view of the dielectric window of FIG. 3, when viewed from a transversal side thereof.

Now, a configuration of the dielectric window 41 in accordance with the present illustrative embodiment will be elaborated. FIG. 3 is a cross sectional view of the dielectric window 41 in accordance with the illustrative embodiment and corresponds to the cross section shown in FIG. 1. FIG. 4 is a diagram of the dielectric window 41 shown in FIG. 3, when viewed from the bottom thereof, i.e., from a direction of an arrow IV of FIG. 3. FIG. 5 is a diagram of the dielectric window 41 of FIG. 3, when viewed from the top thereof, i.e., from a direction opposite to the direction of the arrow IV of FIG. 3. FIG. 6 is a side view of the dielectric window, when viewed from a transversal side thereof. A cross section along a line III-III of FIG. 4 corresponds to FIG. 3.

Referring to FIGS. 1 to 6, the dielectric window 41 in accordance with the illustrative embodiment has a substantially circular plate shape and has a certain plate thickness. The dielectric window 41 is made of a dielectric material. By way of non-limiting example, the dielectric window 41 is made of quartz or alumina. The dielectric window 41 is provided in the plasma processing apparatus 11 by being mounted on the annular member 19c as a part of the sidewall 19b of the processing chamber 12.

A through hole 42 is formed at the center of the dielectric window 41 in a diametrical direction thereof. The through hole 42 is formed through the dielectric window 41 in a thickness direction thereof, i.e., in a vertical direction of FIG. 3. A lower region of the through hole 42 serves as a gas supply opening 23 of the central gas supply unit 24. An upper region of the through hole 42 serves as a recess 43 in which the injector 45 of the central gas supply unit 24 is accommodated. Further, a center 44a of the dielectric window 41 in its diametrical direction is shown by a dashed-dotted line in FIG. 3.

A first dielectric window recess 47 is formed on the dielectric window 41 so as to be located outside a bottom surface 46 of the dielectric window 41 in the diametrical direction. The bottom surface 46 is positioned on the side where plasma is generated when the dielectric window 41 is mounted in the plasma processing apparatus 11. The first dielectric window recess 47 is extended in a ring shape and has a tapered shape inwardly in the plate thickness direction of the dielectric window 41, here, in an upward direction of FIG. 3. The bottom surface 46 is formed on a central region of the dielectric window 41 in the diametrical direction. The bottom surface 46 is formed as a flat surface straightly elongated in the diametrical direction, except for the region where second dielectric window recesses 53a to 53g to be described later are formed. The first dielectric window recess 47 includes an inner tapered surface 48 extended outward from a periphery region of the bottom surface 46 in a tapered shape, i.e., inclined with respect to the bottom surface 46 in the upward and outward direction of FIG. 3; a flat surface 49 straightly extended outward from the inner tapered surface 48 in parallel to the bottom surface 46; and an outer tapered surface 50 extended outward from the flat surface 49 in a tapered shape, i.e., inclined with respect to the flat surface 49 in a downward and outward direction of FIG. 3. Angles for the tapered surfaces, e.g., an angle defined in a direction in which the inner tapered surface 48 is extended with respect to the flat surface 49 and an angle defined in a direction in which the outer tapered surface 50 is extended with respect to the flat surface 49 are set to predetermined values, respectively. In the present illustrative embodiment, the angles are set to be same at any positions in the circumferential direction of the dielectric window 41. The inner tapered surface 48, the flat surface 49 and the outer tapered surface 50 are extended as smooth curved surfaces, respectively. Further, on an outer region of the outer tapered surface 50, there is provided a flat surface 52 straightly extended outward in the diametrical direction, in parallel to the bottom surface 46. The flat surface 52 serves as a supporting surface for the dielectric window 41. That is, the dielectric window 41 is mounted in the plasma processing apparatus 11 such that the flat surface 52 is placed on an upper end surface 19d of an inner region of the annular member 19c. Further, an O-ring groove 19e for accommodating the O-ring 21 is formed on the upper end surface 19d and recessed in the downward direction of FIG. 1. Further, to facilitate understanding, a region where the first dielectric window recess 47 is formed is indicated by a dashed line in FIG. 4.

By providing the first dielectric window recess 47, there is formed, on the outer region of the dielectric window 41 in the diametrical direction, a region where the thickness of the dielectric window 41 varies continuously. Accordingly, there can be provided a resonance region having a thickness of dielectric window 41 suitable for various processing conditions for plasma generation. With this configuration, under various processing conditions, high stability of plasma can be obtained at the outer region in the diametrical direction.

Here, the second dielectric window recess 53a is formed between the center of the dielectric window 41 and the first dielectric window recess 47. The second dielectric window recess 53a is recessed inwardly from the bottom surface 46 in the thickness direction of the dielectric window, here, in the upward direction of FIG. 3. The second dielectric window recess 53a is recessed from the bottom surface 46 in the straightly upward direction of FIG. 3. When viewed from the thickness direction of the dielectric window 41, i.e., when viewed from the downward direction of FIG. 3, the second dielectric window recess 53a has a circular hole shape. That is, the second dielectric window recess 53a has a cylindrical surface 54 straightly extended from the bottom surface 46 in the upward direction of FIG. 3; and a flat surface 55 straightly extended from an upper end of the cylindrical surface 54 in a diametrical direction of the dielectric window 41 in parallel to the bottom surface 46.

In accordance with the present illustrative embodiment, the total number of the second dielectric window recesses 53a is seven. The shapes of the seven second dielectric window recesses 53a, 53b, 53c, 53d, 53e, 53f and 53g are same. That is, the second dielectric window recesses 53a to 53g are same in, e.g., their sizes, hole diameters and the way and degree in which they are extended. The seven second dielectric window recesses 53a to 53g are arranged at a regular interval so as to have rotation symmetry with respect to a center 56 of the dielectric window 41 in the diametrical direction. When viewed from the thickness direction of the dielectric window 41, centers 57a, 57b, 57c, 57d, 57e, 57f and 57g of the circular hole-shaped seven second dielectric window recesses 53a to 53g are positioned on a circle 58 centered about the center 56 of the dielectric window 41. That is, with this arrangement of the second dielectric window recesses 53a to 53g, if the dielectric window 41 is rotated 51.42 degrees (=360 degrees/7) about the center 56 of the dielectric window 41, the same arrangement as before the dielectric window 41 is rotated is obtained. The circle 58 is marked by a dashed-dotted line in FIG. 4. A PCD (Pitch circle Diameter) of the circle 58 indicated by a length $L_1$ in FIG. 4 is set to be, e.g., about 154 mm, and the diameter of each of the second dielectric window recesses 53a to 53g indicated by a length $L_2$ in FIG. 4 is set to be, e.g., about ϕ30 mm. Further, the depth of the second dielectric window recess 53a, i.e., a distance between the bottom surface 46 and the flat surface in the thickness direction indicated by a length $L_3$ in FIG. 3 is set to have a certain value. In the present illustrative embodiment, the length $L_3$ is set to be about 32 mm, for example. Further, in the present illustrative embodiment, the diameter of the dielectric window 41 is, e.g., about 458 mm.

By providing the second dielectric window recesses 53a to 53g, an electric field of the microwave can be concentrated. Accordingly, a mode locking can be performed firmly in the inner region of the dielectric window 41 in the diametrical direction. In such a case, even if processing conditions are varied in wide variety, a firmly mode-locked region can be formed in the inner region of the dielectric window 41 in the diametrical direction. Since the seven second dielectric window recesses 53a to 53g have rotation symmetry, the firmly mode-locked region can also have high axial symmetry in the inner region of the dielectric window 41 in the diametrical direction. Thus, generated plasma also has high axial symmetry.

As described above, the dielectric window 41 having the above-described configuration has a wide range of process margin and plasma generated by using this dielectric window 41 has high axial symmetry.

As for the range of the process margin, a required range of process margin can be obtained by varying the size or the position of the second dielectric window recess. Further, as for the processing uniformity in the diametrical direction, there are a center fast phenomenon and an edge fast phenomenon. In the center fast phenomenon, an etching rate at a center portion of a processing target substrate in a diametrical direction is higher than an etching rate at a periphery portion of the substrate in the diametrical direction, i.e., an edge portion of the processing target substrate. In the edge fast phenomenon as a reverse phenomenon to the center fast phenomenon, the etching rate at the center portion of the processing target substrate is lower than the etching rate at the periphery portion thereof in the diametrical direction. By varying the size or the position of the second dielectric window recess, however, it is possible to appropriately cope with the center fast phenomenon or the edge fast phenomenon. Meanwhile, by adjusting processing conditions in the plasma processing apparatus having the above-described configuration in accordance with the illustrative embodiment, it is possible to reduce the center fast phenomenon or the edge fast phenomenon to decrease the influence thereof. That is, with the configuration of the plasma processing apparatus in accordance with the present illustrative embodiment, a required wide range of process margin and processing uniformity in the circumferential direction can be obtained. Further, by adjusting processing conditions, the processing uniformity in the diametrical direction can be improved. These effects will be elaborated later.

Here, as a position adjusting device configured to adjust a position of the dielectric window 41 in the circumferential direction thereof, dielectric window graduations 60 are marked on the top surface 59 of the dielectric window 41 and at a regular interval in the circumferential direction of the dielectric window 41. Further, the dielectric window graduations 60 are marked on a region of the dielectric window 41 that is not covered by the slot antenna plate 31 when the slot antenna plate 31 is mounted on the dielectric window 41. To be specific, the dielectric window graduations 60 are marked between the first dielectric window recess 47 and an edge portion of the dielectric window 41. By providing the dielectric window graduations 60, it is easy to position the dielectric window 41 in the circumferential direction. Further, for the simplicity of illustration, a part of the dielectric window graduations 60 is omitted in FIG. 5.

Figure 7:
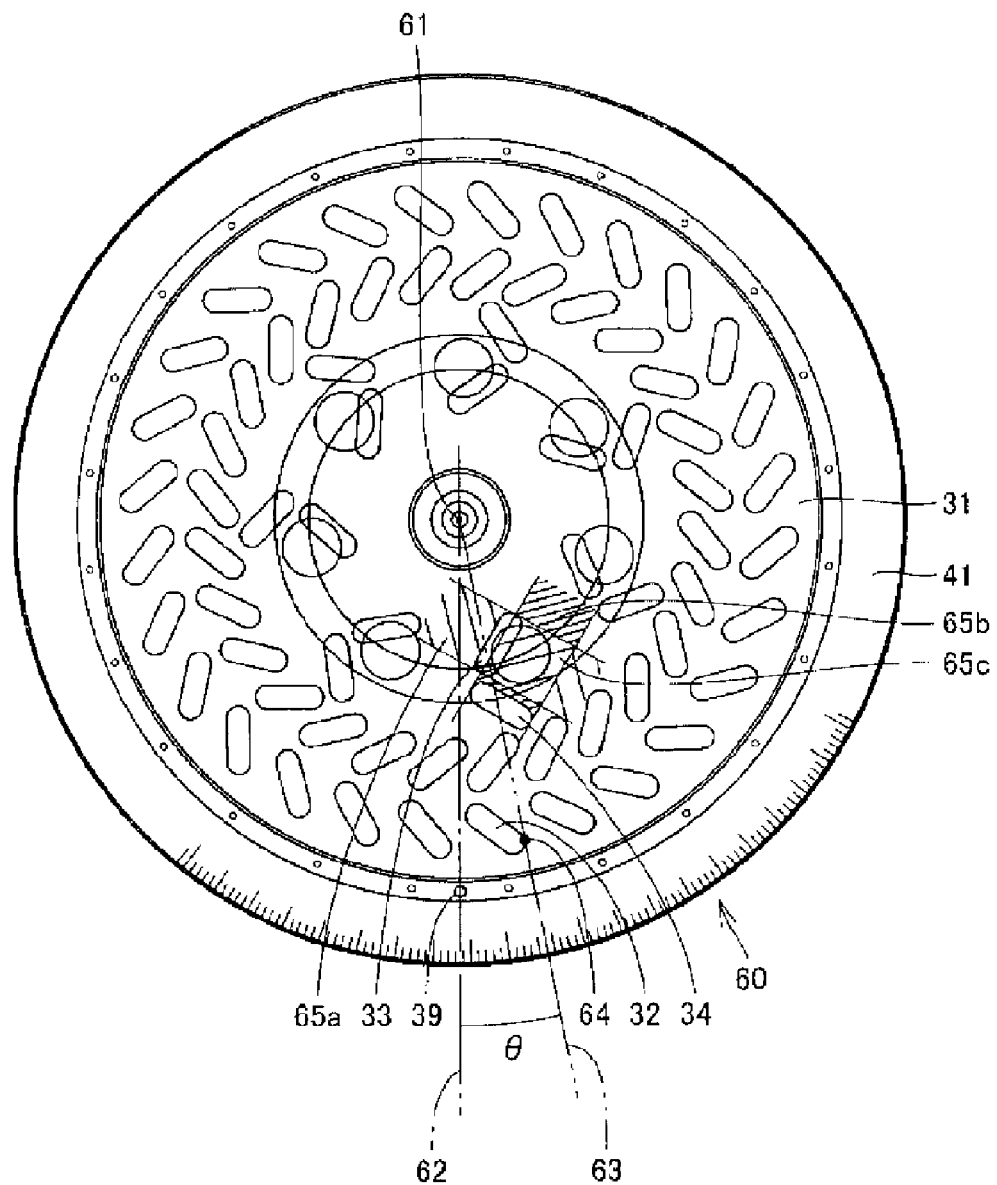
FIG. 7 is a diagram showing a state in which the slot antenna plate and the dielectric window are mounted.

Now, a method for mounting the dielectric window 41 will be explained. FIG. 7 is a diagram showing a state in which the slot antenna plate 31 and the dielectric window 41 are mounted. In FIG. 7, the slot antenna plate 31 is mounted on the dielectric window 41. Referring to FIG. 7, depending on the positions of the second dielectric window recesses 53a to 53g on the dielectric window 41 in the circumferential directions and the slots 32 of the slot antenna plate 31, a distribution of electric field intensity in the circumferential direction of the dielectric window 41 is varied, and, resultantly, intensity of generated plasma is also changed. Especially, in an inner region of the dielectric window 41, the distribution of the electric field intensity changes greatly depending on whether or not the region where the second dielectric window recesses 53a to 53g are formed is overlapped with the region where the slots are formed in the thickness direction thereof or depending on the overlapped state therebetween.

By way of example, when the second dielectric window recesses 53a to 53g are viewed from the plate thickness direction, it is desirable that each of the second dielectric window recesses 53a to 53g is located in a region 65c where a region 65a having a width equal to a long side of the first slot 33 and a region 65b having a width equal to a long side of the second slot 34 are overlapped. Here, the state in which each of the second dielectric window recesses 53a to 53g is located in the region 65c includes not only a state in which each of the second dielectric window recesses 53a to 53g is completely included in the region 65c but also a state in which a part of the region 65c and a part of each of the second dielectric window recesses 53a to 53g are overlapped. Since such a region 65c is an area where the electric field intensity is higher, microwave can be sufficiently supplied into the second dielectric window recesses 53a to 53g. Further, in this case, the seven slot pairs 40 of the inner slot pair group 35 can be formed to be located at positions corresponding to where the second dielectric window recesses 53a to 53g are formed, respectively. Accordingly, the microwave can be supplied into the second dielectric window recesses 53a to 53g efficiently. In FIG. 7, the regions 65a, 65b and 65c are marked by different hatchings.

When mounting the dielectric window 41 in the plasma processing apparatus 11, the dielectric window 41 is mounted in the plasma processing apparatus 11 while controlling the positional relationship between the second dielectric window recesses 53a to 53g of the dielectric window 41 and the slots 32 of the slot antenna plate 31 in the circumferential direction. Here, the dielectric window graduations 60 for adjusting the position of the dielectric window 41 in the circumferential direction and the reference hole 39 formed at the slot antenna plate 31 as a reference mark for the position in the circumferential direction are used. To elaborate, with centers of the slot antenna plate 31 and the dielectric window 41 as a center 61, an angle θ formed between an imaginary line 62 marked by a dashed dotted line connecting the center 61 and the center of the reference hole 39 and an imaginary line 63 marked by a dashed double dotted line connecting the center 61 and an end portion 64 of an outermost slot 32 in the circumferential direction is set to a required value θ by rotating the dielectric window with respect to the slot antenna plat 31 based on a previously investigated relationship between the angle θ and the distribution of the electric field intensity.

In this way, the position of the dielectric window 41 in the circumferential direction can be more easily adjusted. That is, the second dielectric window recesses 53a to 53g formed on the dielectric window 41 are hidden when viewed from above, i.e., from the slot antenna plate 31. Thus, it may be difficult to adjust the position of the dielectric window 41 in the circumferential direction while watching it from above. With the above-described configuration, however, by using the dielectric window graduations 60 and the reference hole 39, the position of the dielectric window 41 with respect to the slot antenna plate 31 in the circumferential direction can be more easily adjusted.

Here, a controller provided in the plasma processing apparatus 11 may automatically position the dielectric window 41 in the circumferential direction with respect to the slot antenna 31. That is, by way of example, the position adjusting device configured to adjust the position of the dielectric window 41 in the circumferential direction may include a rotation device for rotating the dielectric window 41 in the circumferential direction; the position of the reference hole 39 or a scale on the dielectric window graduations 60 may be detected by a sensor; and the dielectric window 41 may be rotated to obtain an angle θ inputted to the controller.

Figure 8:
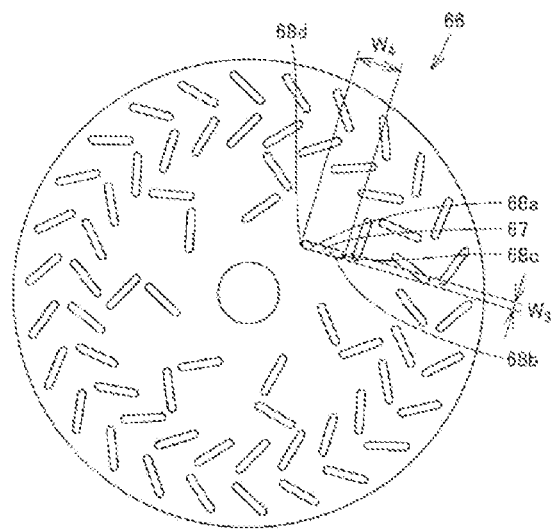
FIG. 8 is a diagram showing a slot antenna plate having a smaller number of slots than the slot antenna plate shown in FIG. 2, when viewed from a thickness direction of the slot antenna plate.

Further, in the above-described illustrative embodiment, the plasma processing apparatus is described to include the slot antenna plate having the shape shown in FIG. 2. However, the shape of the slot antenna plate may not be limited thereto. By way of example, the number of the slots or the arrangement state of the slots may be modified in various ways. For example, while maintaining the number and the arrangement state of the slots of the inner slot pair groups, the number of the slot pairs of the outer slot pair group may be changed from 28 to 26, and the 26 slot pairs may be arranged at a regular interval, as in a slot antenna plate 66 shown in FIG. 8. FIG. 8 is a diagram showing the slot antenna plate 66 having a smaller number of slots than that of the slot antenna plate shown in FIG. 2. In FIG. 8, each slot 67 of this slot antenna plate 66 has a smaller opening width than that of each slot of the slot antenna plate shown in FIG. 2. In this illustrative embodiment, an opening width of the slot 67, i.e., a length $W_3$ between one wall portion 68a extended in a lengthwise direction of the slot 67 and the other wall portion 68b extended in the lengthwise direction of the slot 67 is set to be, e.g., about 6 mm. This length $W_3$ is equivalent to about half the length $W_1$ of the slot 33 of the slot antenna plate shown in FIG. 2. Meanwhile, in FIG. 8, a length of the slot 67, i.e., a length $W_4$ between one end portion 68c in the lengthwise direction of the slot 67 and the other end portion 68d in the lengthwise direction of the slot 67 is set to be, e.g., about 50 mm. This length $W_4$ is equivalent to the length $W_2$ of the slot 33 of the slot antenna plate shown in FIG. 2. As for the slot 67, a ratio ($W_3/W_4$) of the short side length to the long side length is set to be, e.g., about 6/50, i.e., about 1/8. The other configuration of the slot is the same as that of the slot antenna plate 31 shown in FIG. 2, redundant description will be omitted.

Here, as for the opening shape of the slot, as the opening width of the slot increases, a microwave power is decreased. However, it is possible to reduce the influence caused by deviation of the slot position in the circumferential direction of the slot antenna plate. That is, if the opening width of the slot becomes smaller, the microwave can be radiated more intensely. However, radiation of the microwave may be weakened extremely due to deviation of the slot position in the circumferential direction of the slot antenna plate and non-uniformity in propagation of the microwave. On the other hand, if the opening width of the slot becomes larger, the radiation of the microwave would be weakened in overall. However, the radiation of the microwave may not be weakened extremely even if the slot position is deviated in the circumferential direction of the slot antenna plate and the microwave is non-uniformly propagated.

Figure 9:
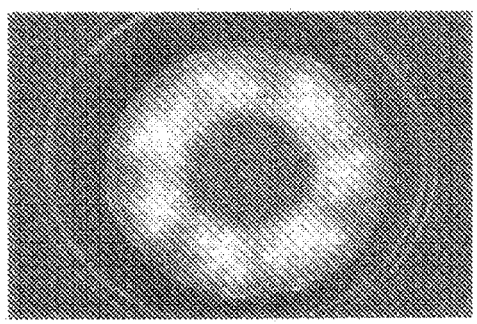
FIG. 9 is a picture showing a state in which plasma is generated in a first plasma processing apparatus.
Figure 10:
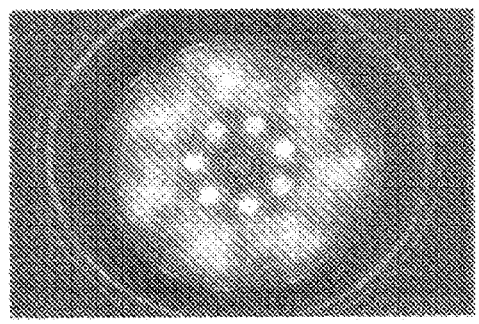
FIG. 10 is a picture showing a state in which plasma is generated in the plasma processing apparatus of FIG. 1.

Now, a plasma generation state in the plasma processing apparatus will be explained. FIG. 9 is a picture showing a state in which plasma is generated in a first plasma processing apparatus. FIG. 10 is a picture showing a state in which plasma is generated in the plasma processing apparatus 11 having the above-described configuration. FIGS. 9 and 10 are pictures of the dielectric window taken from the thickness direction of the dielectric window. Herein, the first plasma processing apparatus is configured to include the slot antenna plate as shown in FIG. 2 and a dielectric window only having a first dielectric window recess. As for processing conditions, an internal pressure of a processing chamber is set to, e.g., about 100 mTorr; a microwave power is set to be, e.g., about 1000 W; an argon (Ar) gas and an oxygen ($O_2$) gas are supplied; and flow rates of Ar/$O_2$ are set to be, e.g., about 300 sccm/about 500 sccm.

Referring to FIG. 9, in the first plasma processing apparatus, there can be observed intense emissions of plasma at a substantially regular interval in a circumferential direction in an outer region of the dielectric window. However, in an inner region of the dielectric window in the diametrical direction, no intense plasma emission is observed. In contrast, referring to FIG. 10, in the plasma processing apparatus in accordance with the present illustrative embodiment, in an outer region of the dielectric window in the diametrical direction, there are observed intense emissions of plasma generated at a substantially regular interval in the circumferential direction. Further, seven intense emissions of plasma in regions corresponding to the second dielectric window recesses are also observed in an inner region of the dielectric window.

Figure 11:
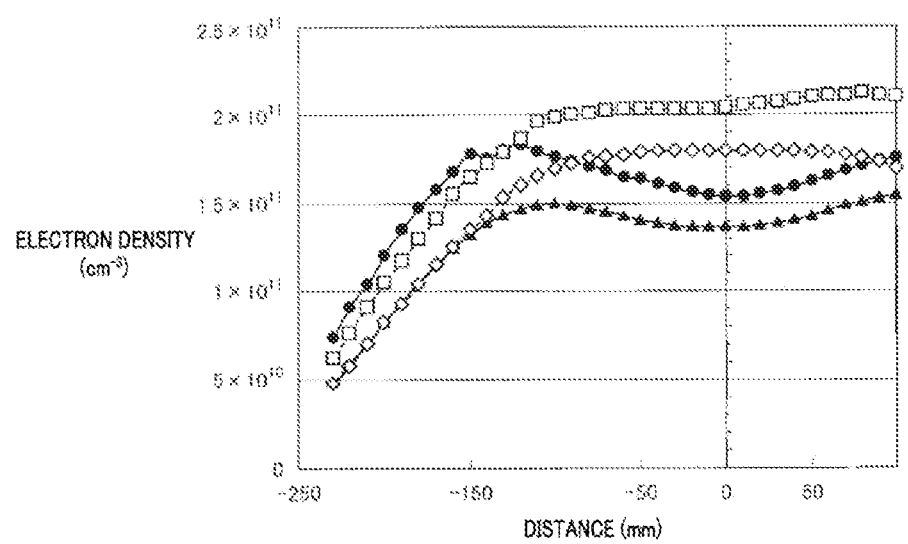
FIG. 11 is a graph showing a relationship between an electron density of plasma and a distance from a center of a processing target substrate W.

Now, an electron density state of plasma in the plasma processing apparatus will be explained. FIG. 11 is a graph showing a relationship between an electron density of plasma and a distance from a center of a processing target substrate W. In FIG. 11, a vertical axis represents an electron density (cm-3) and a horizontal axis represents a distance (mm) from the center O of the processing target substrate W. To measure the electron density, a PAP (Plasma Absorption Probe) is used. As for a measuring position within the processing chamber in a height direction, it is measured at a position of about 100 mm downward from the flat surface 52 as a supporting surface shown in FIG. 1. Further, it is measured within the range of, e.g., about −240 mm to about +100 mm from the center of the processing target substrate W. Furthermore, a gas is supplied only from the outer gas supply unit without being supplied from the center gas supply unit.

In FIG. 11, white rhombuses represent a case where an internal pressure of the processing chamber is set to about 50 mTorr, a microwave power is set to about 1500 W, and flow rates of Ar/$O_2$ are set to about 500 sccm/about 300 sccm in the plasma processing apparatus shown in FIG. 1. White squares indicate a case where an internal pressure of the processing chamber is set to about 50 mTorr, a microwave power is set to about 2000 W and flow rates of Ar/$O_2$ are set to about 200 sccm/about 600 sccm in the plasma processing apparatus shown in FIG. 1. Black triangles represent a case where an internal pressure of the processing chamber is set to about 50 mTorr, a microwave power is set to about 1500 W and flow rates of Ar/$O_2$ are set to about 500 sccm/about 300 sccm in the first plasma processing apparatus that emits plasma as shown in FIG. 9. Black circles indicate a case where an internal pressure of the processing chamber is set to about 50 mTorr, a microwave power is set to about 2000 W and flow rates of Ar/$O_2$ are set to about 200 sccm/about 600 sccm in the first plasma processing apparatus that emits plasma as shown in FIG. 9.

Referring to FIG. 11, in the first plasma processing apparatus, a peak of electron density is observed near a distance of about −150 mm to about −130 mm from the center of the processing target substrate W, and the graph is found to decrease toward the vicinity of the center of the processing target substrate, i.e., toward the distance of 0 mm, which implies that the electron density decreases in the vicinity of the center of the processing target substrate. In contrast, in the plasma processing apparatus shown in FIG. 1, a decrease of electron density in the central region as in the first plasma processing apparatus is not observed, and the electron density is found to be substantially constant in the range from about −100 mm to the central region.

Figure 12:
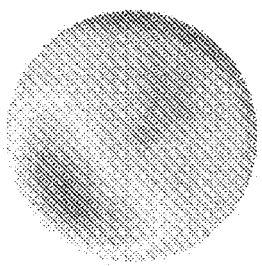
FIG. 12 is a diagram showing a processing state of a processing target substrate when an etching process is performed in the first plasma processing apparatus under the condition that a microwave power is, e.g., about 2000 W.
Figure 13:
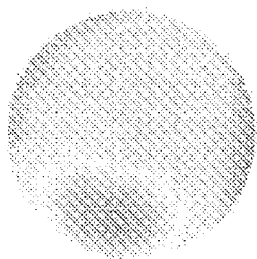
FIG. 13 is a diagram showing a processing state of a processing target substrate when an etching process is performed in a second plasma processing apparatus under the condition that a microwave power is, e.g., about 2000 W.
Figure 14:
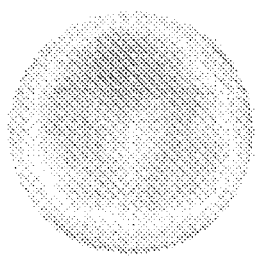
FIG. 14 is a diagram showing a processing state of a processing target substrate when an etching process is performed in the plasma processing apparatus shown in FIG. 1 under the condition that a microwave power is, e.g., about 2000 W.

Now, a difference in the processing degree between the plasma processing apparatus 11 having the above-described configuration and other plasma processing apparatuses will be explained. FIGS. 12 and 13 are diagrams showing processing states of processing target substrates when an etching process is performed in other plasma processing apparatuses. FIG. 12 depicts a case of the first plasma processing apparatus, specifically, a plasma processing apparatus using a slot antenna plate as shown in FIG. 2 and a dielectric window only having a first dielectric window recess. FIG. 13 shows a case of a second plasma processing apparatus, specifically, a plasma processing apparatus using a slot antenna plate as shown in FIG. 8 and a dielectric window only having a first dielectric window recess. FIG. 14 is a diagram showing a processing state of a processing target substrate when an etching process is performed in the plasma processing apparatus shown in FIG. 1. In FIGS. 12 to 14, the darkness degree of image indicates the processing degree. That is, regions having the same darkness of image are regions having same etching depths.

Figure 15:
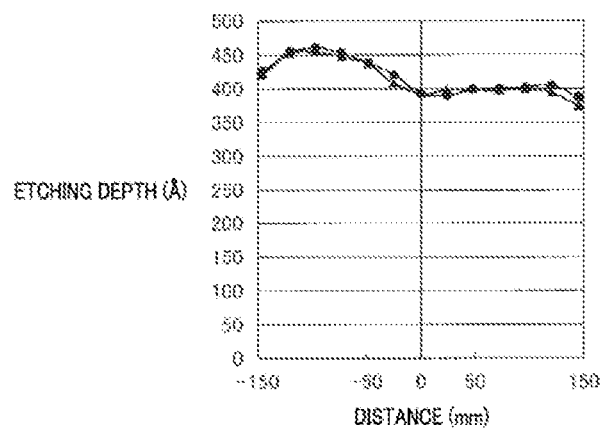
FIG. 15 is a graph showing a relationship between an etching depth and a distance from a center of a processing target substrate when an etching process is performed in the first plasma processing apparatus under the condition that a microwave power is, e.g., about 2000 W.
Figure 16:
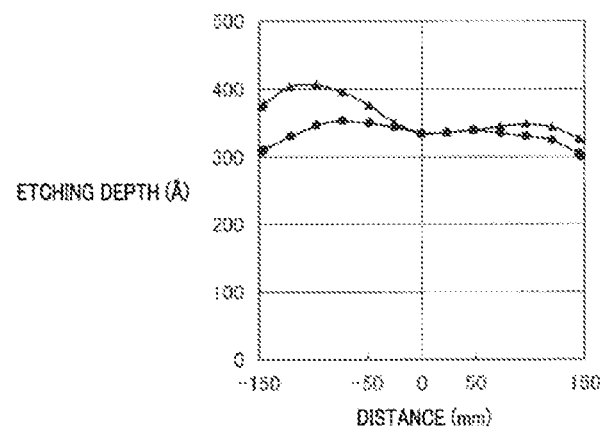
FIG. 16 is a graph showing a relationship between an etching depth and a distance from a center of a processing target substrate when an etching process is performed in the second plasma processing apparatus under the condition that a microwave power is, e.g., about 2000 W.
Figure 17:
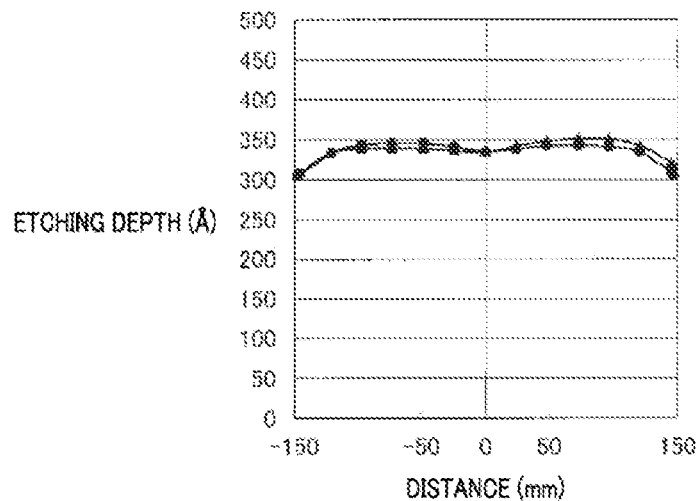
FIG. 17 is a graph showing a relationship between an etching depth and a distance from a center of a processing target substrate when an etching process is performed in the plasma processing apparatus shown in FIG. 1 under the condition that a microwave power is, e.g., about 2000 W.

FIG. 15 is a graph showing a relationship between an etching depth and a distance from a center of a processing target substrate when an etching process is performed in the first plasma processing apparatus. FIG. 16 is a graph showing a relationship between an etching depth and a distance from a center of a processing target substrate when an etching process is performed in the second plasma processing apparatus. FIG. 17 is a graph showing a relationship between an etching depth and a distance from a center of a processing target substrate when an etching process is performed in the plasma processing apparatus shown in FIG. 1. In each of FIGS. 15 to 17, a vertical axis represents an etching depth (Å) and a horizontal axis represents a distance (mm) from a center of the processing target substrate. Further, in each of FIGS. 15 to 17, black circles represent etching depths measured at positions on an X axis passing through the center of the processing target substrate and elongated in left-right directions, and black triangles indicate etching depths measured at positions on a Y axis that passes through the center of the processing target substrate and is orthogonal to the X axis. That is, the Y axis is an axis vertically elongated in up and down directions of the processing target substrate shown in each of FIGS. 12 to 14. A minus distance on the Y axis represents a region below the center of the processing target substrate in each of FIGS. 12 to 14. Further, a minus distance on the X axis represents a region on the left of the center of the processing target substrate in each of FIGS. 12 to 14. As for processing conditions, an internal pressure of the processing chamber is set to be, e.g., about 20 mTorr; a microwave power is set to, e.g., about 2000 W; a RF bias power is set to, e.g., about 80 W; and flow rates of $Ar/CHF_3/O_2$ are set to, e.g., about 450 sccm/about 50 sccm/about 2 sccm.

Referring to FIGS. 12, 13, 15 and 16, in the other plasma processing apparatuses, non-uniformity in etching depth, i.e., discrepancy in the processing degree within the surface of the processing target substrate is found to be high. Especially, non-uniformity in the distribution of etching depth is especially high in the circumferential direction. In contrast, referring to FIGS. 14 and 17, in the plasma processing apparatus in accordance with the illustrative embodiment, non-uniformity in etching depth is low and discrepancy in the distribution of etching depths is found to be small.

Figure 18:
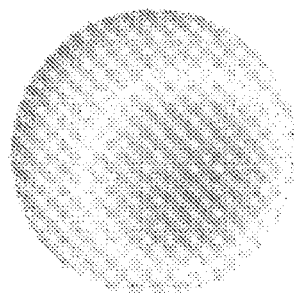
FIG. 18 is a diagram showing a processing state of a processing target substrate when an etching process is performed in the second plasma processing apparatus under the condition that a microwave power is, e.g., about 3000 W.
Figure 19:
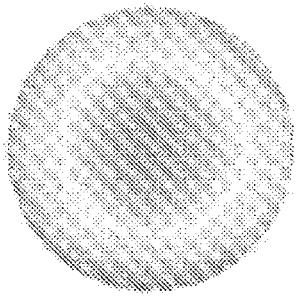
FIG. 19 is a diagram showing a processing state of a processing target substrate when an etching process is performed in the plasma processing apparatus shown in FIG. 1 under the condition that a microwave power is, e.g., about 3000 W.
Figure 20:
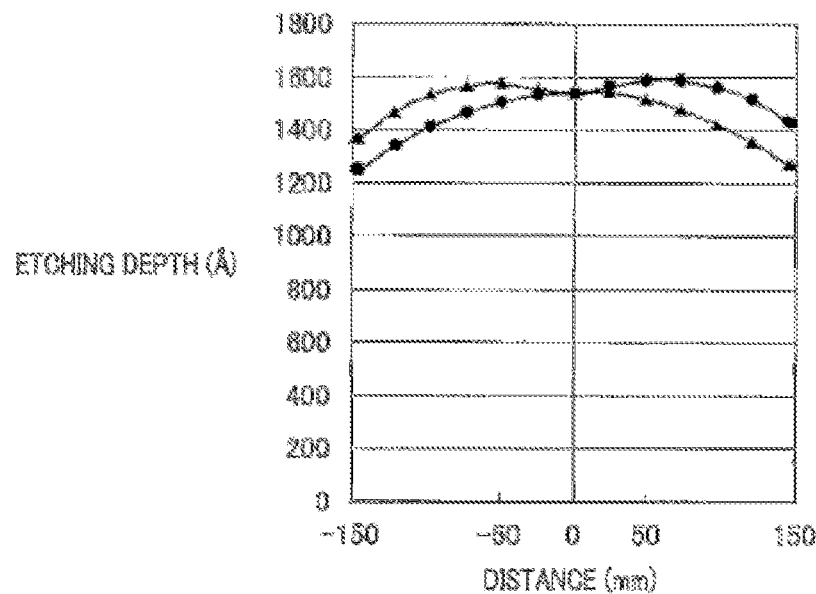
FIG. 20 is a graph showing a relationship between an etching depth and a distance from a center of a processing target substrate when an etching process is performed in the second plasma processing apparatus under the condition that a microwave power is, e.g., about 3000 W.
Figure 21:
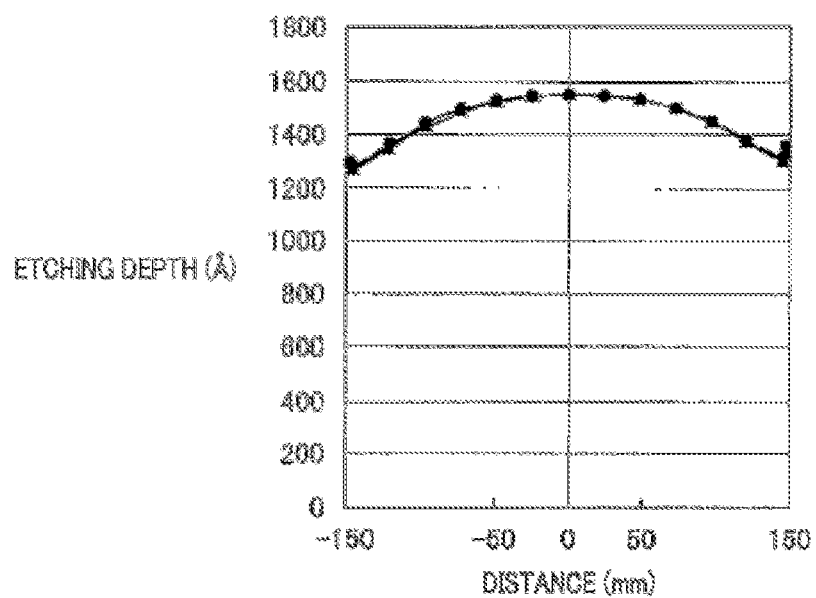
FIG. 21 is a graph showing a relationship between an etching depth and a distance from a center of a processing target substrate when an etching process is performed in the plasma processing apparatus shown in FIG. 1 under the condition that a microwave power is, e.g., about 3000 W.

Further, the relationship between the etching depth and the distance from the center of the processing target substrate is also investigated while varying the processing conditions. To elaborate, FIGS. 18 to 21 depict cases where an internal pressure of the processing chamber is set to, e.g., about 20 mTorr; a microwave power is set to, e.g., about 3000 W; a RF bias power is set to, e.g., about 200 W; and flow rates of $Ar/CH_4$ are set to, e.g., about 500 sccm/about 100 sccm. FIG. 18 indicates a case of the same apparatus configuration as shown in FIG. 13. FIG. 19 shows a case of the same apparatus configuration as shown in FIG. 14. FIG. 20 depicts a case of the same apparatus configuration as shown in FIG. 16. FIG. 21 shows a case of the same apparatus configuration as shown in FIG. 17. Referring to FIGS. 18 to 21, the same tendency as described in FIGS. 12 to 17 is observed.

Figure 22:
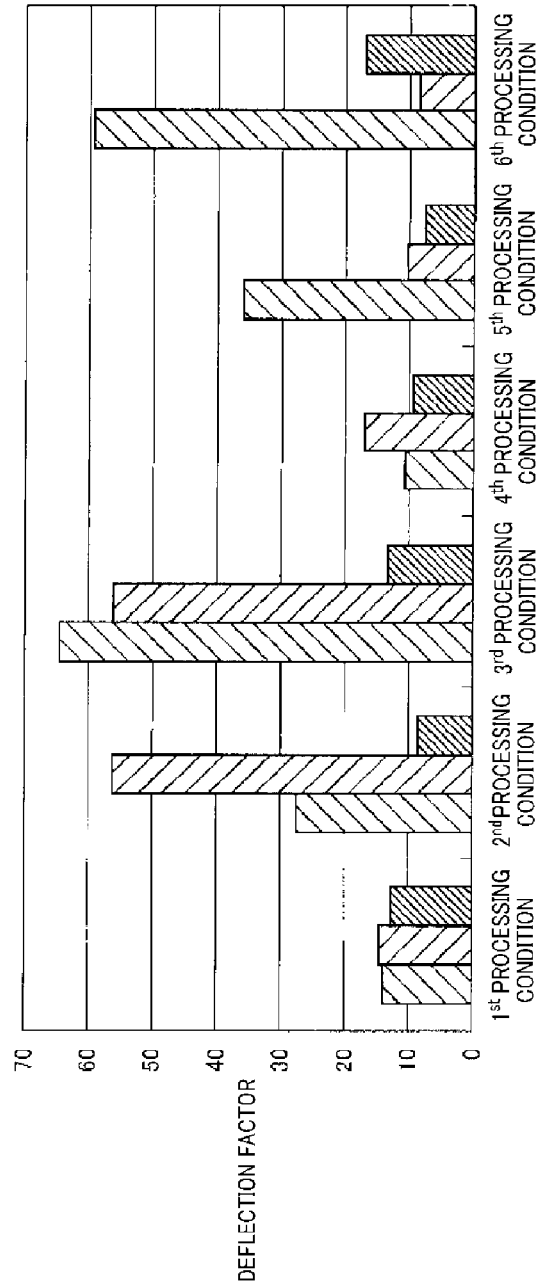
FIG. 22 is a graph showing a deflection factor and a processing condition.

FIG. 22 is a graph showing a relationship between a deflection factor and a processing condition. A vertical axis represents a value of a deflection factor (%), and a horizontal axis represents a processing condition. Among the bar graphs shown in FIG. 22, the left graph indicates a case of the second plasma processing apparatus including the slot antenna plate as shown in FIG. 8 and the dielectric window only having the first dielectric window recess; the middle graph indicates a case of the first plasma processing apparatus including the slot antenna plate as shown in FIG. 2 and the dielectric window only having the first dielectric window recess; and the right graph indicates a case of the plasma processing apparatus in accordance with the illustrative embodiment shown in FIG. 1.

Here, the deflection factor is a sum of processing uniformities (%) in a circumferential direction of a processing target substrate. The processing uniformities are calculated at positions increased by every about 25 mm in diameter from the center of the processing target substrate to a position of about 150 mm toward the edge of the processing target substrate, and also calculated at the outermost position of about 152 mm. For example of the elaborate calculating method, as for the middle graph under the second processing condition, i.e., for the case of the first plasma processing apparatus including the slot antenna plate as shown in FIG. 2 and the dielectric window only having the first dielectric window recess, a processing uniformity in the circumferential direction at a position of about 25 mm is about 2%; a processing uniformity in the circumferential direction at a position of about 50 mm is about 6%; a processing uniformity in the circumferential direction at a position of about 75 mm is about 8%; a processing uniformity in the circumferential direction at a position of about 100 mm is about 11%; a processing uniformity in the circumferential direction at a position of about 125 mm is about 11.5%; a processing uniformity in the circumferential direction at a position of about 150 mm is about 13%; and a processing uniformity in the circumferential direction at a position of about 152 mm is about 13%. In this case, the deflection factor is about 64.5% as the sum of all these values.

As for the deflection factor, as the value of the defection factor itself decreases, it implies that the discrepancy in the processing degree in the circumferential direction is small. Thus, it is desirable that the defection factor has a small value. Further, in order to obtain a wide range of process margin, it is desirable that differences between deflection factors under respective processing conditions are also small. That is, even if a deflection factor under a certain processing condition is small, if a deflection factor under the other processing condition is large, such a distribution may be undesirable. That is, in consideration of the processing uniformity in the circumferential direction, in order to improve robust property of the plasma processing apparatus, i.e., to reduce influence on the processing uniformity due to the variation in the processing conditions, it is desirable that a deflection factor has a small value and a difference between defections factors under respective processing conditions is also small. Here, for the processing conditions shown on the horizontal axis of FIG. 22, there are six patterns of the first processing condition to the sixth processing condition. The details of the respective processing conditions are shown in Table 1. Further, the first and the second processing conditions represent an example etching process of an organic film, the third to the sixth processing conditions represent an example etching process of an oxide film.

TABLE 1

| | Internal Temperature of Processing Chamber (mTorr) | Microwave Power (W) | RF Bias (W) | Gas Kind | Gas Flow rate (sccm) |
|---|---|---|---|---|---|
| 1$^{st}$ Processing Condition | 150 | 1500 | 200 | Ar/HBr/O$_2$ | 300/25/5 |
| 2$^{nd}$ Processing Condition | 20 | 3000 | 300 | Ar/Cl$_2$ | 400/50 |
| 3$^{rd}$ Processing Condition | 20 | 2000 | 80 | Ar/CHF$_3$/O$_2$ | 450/50/2 |
| 4$^{th}$ Processing Condition | 40 | 3000 | 200 | Ar/CF$_4$ | 500/100 |
| 5$^{th}$ Processing Condition | 20 | 3000 | 200 | Ar/CF$_4$ | 500/100 |
| 6$^{th}$ Processing Condition | 20 | 1500 | 200 | Ar/CF$_4$ | 500/100 |

Referring to FIG. 22 and Table 1, in the plasma processing apparatus in accordance with the illustrative embodiment, the values of the deflection factors are small under all of the processing conditions. A maximum deflection factor is just about 17 under the sixth processing condition. Meanwhile, in the second plasma processing apparatus, although deflection factors are small under some of the processing conditions, values of the deflection factors are large as about 60 under the third and sixth processing conditions. Likewise, in the first plasma processing apparatus, although deflection factors are small under some of the processing conditions, values of the deflection factors are large as about 55 under the second and third processing conditions. That is, in the aspect of improving the robust property of the plasma processing apparatus, the plasma processing apparatus in accordance with the illustrative embodiment is advantageous.

Such advantage may be achieved for the reason as follows. Under the first processing condition, the pressure is relatively high as about 150 mTorr and there is hardly found a difference in deflection factors for respective cases. Under the second to sixth processing conditions, however, the pressure is relatively low as about 20 mTorr to about 40 mTorr. In this low-pressure condition, plasma tends to be deflected easily. In the plasma processing apparatus in accordance with the present illustrative embodiment, however, since the slot antenna plate having the slots with the relatively large widths is provided in addition to the dielectric window having the above-described configuration, uniformity of microwave radiation in the circumferential direction can be higher. Accordingly, the robust property of the plasma processing apparatus can be improved. That is, by setting the ratio of the short side length of each slot to the long side length of the slot to be equal to or larger than about ¼, the processing uniformity can be obtained even under a low pressure condition, while preventing deviation of the slot antenna plate in the circumferential direction. Further, the robust property of the plasma processing apparatus can be improved.

Figure 23:
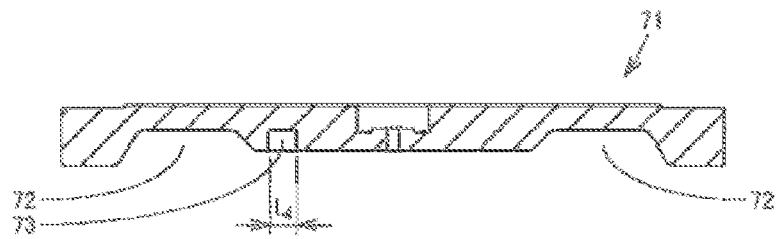
FIG. 23 is a cross sectional view schematically illustrating a dielectric window in accordance with another illustrative embodiment.
Figure 24:
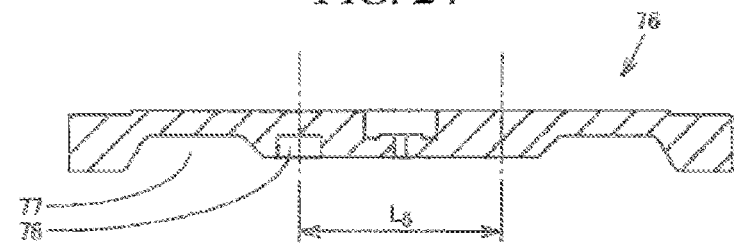
FIG. 24 is a cross sectional view schematically illustrating a dielectric window in accordance with still another illustrative embodiment.

The shape of the dielectric window may not be limited to the example shown in FIG. 3. By way of example, the dielectric window may have shapes as shown in FIGS. 23 and 24. FIG. 23 is a cross sectional illustrating a dielectric window in accordance with another illustrative embodiment. FIG. 24 is a cross sectional view illustrating a dielectric window in accordance with still another illustrative embodiment. The cross sections shown in FIGS. 23 and 24 correspond to the cross section shown in FIG. 3.

Referring to FIG. 23, like the dielectric window 41 shown in FIG. 3, a dielectric window 71 in accordance with another illustrative embodiment also includes a taper-shaped first dielectric window recess 72 extended in a ring shape; and second dielectric window recesses 73 straightly recessed in a thickness direction thereof. Here, in comparison with the configuration of the dielectric window 41 of FIG. 3, although the PCD of the second dielectric window recesses 73 are the same as that of the second dielectric window recesses 53a to 53g of the dielectric window 41 of FIG. 3, the size of each second dielectric window recess 73 is smaller than that of each of the second dielectric window recesses 53a to 53g. In accordance with this another illustrative embodiment, a diameter of the second dielectric window recess 73 indicated by a length $L_4$ in FIG. 23, which corresponds to the length $L_2$ in FIG. 4, is set to be about T 20 mm. Referring to FIG. 24, like the dielectric window 41 shown in FIG. 3, a dielectric window 76 in accordance with still another illustrative embodiment includes a taper-shaped first dielectric window recess 77 extended in a ring shape and second dielectric window recesses 78 straightly recessed in a thickness direction thereof. Here, in comparison with the dielectric window 41 of FIG. 3, although the size of each of the second dielectric window recesses 78 are the same as that of the second dielectric window recesses 53a to 53g of the dielectric window 41, the second dielectric window recesses 78 are formed along a circle whose diameter is smaller than the circle along which the second dielectric window recesses 53a to 53g of the dielectric window 41 shown in FIG. 3 are formed. In accordance with this still another illustrative embodiment, a PCD of the second dielectric window recess 78 indicated by a length $L_5$ in FIG. 24, which corresponds to the length $L_1$ of FIG. 4, is set to be, e.g., about 140 mm.

Now, plasma stability evaluated in the other plasma processing apparatuses and the plasma processing apparatuses in accordance with the illustrative embodiments will be discussed. Table 2 shows plasma stability in the dielectric window shown in FIG. 3, the dielectric window shown in FIG. 23, the dielectric window shown in FIG. 24 and the dielectric window having only the first dielectric window recess when a gas flow rate is varied. As for the slot antenna plate 31, the one shown in FIG. 2 is used in all of these apparatuses. In Table 2, a mark ○ indicates a state in which plasma is stabilized; a mark Δ indicates a hunting state, i.e., a state in which matching is not performed in the matching unit and, thus, plasma is not stabilized; and a mark x indicates a state in which a reflection value of microwave exceeds an interlock value set in the plasma processing apparatus and the process is stopped. Further, "MW" presents microwave, and the microwave is set to about 2000 W, about 2500 W and about 3000 W. Further, in the topmost row of Table 2, flow rates (sccm) of Ar/HBr are specified. In Table 2, evaluation results are provided in the order of the plasma processing apparatus having the dielectric window shown in FIG. 3, the plasma processing apparatus having the dielectric window shown in FIG. 24, the plasma processing apparatus having the dielectric window shown in FIG. 23 and the plasma processing apparatus having the dielectric window having only the first dielectric window recess from the top. In Table 2, in a column of the evaluation results, the left side in each processing condition indicates plasma stability on a plasma generation side, i.e., in a region close to where the dielectric window is provided, and the right side indicates plasma stability on a RF bias side, i.e., in a region close to where the holding table is located.

TABLE 2

|  | MW | 1400/200 | | 1200/400 | | 1000/600 | | 800/800 | | 600/1000 | |
|---|---|---|---|---|---|---|---|---|---|---|---|
| Dielectric window: ø30 PCD154 | 2000 | o | o | o | o | o | o | o | o | Δ | o |
|  | 2500 | o | o | o | o | o | o | o | o | o | o |
|  | 3000 | o | o | o | o | o | o | o | o | o | o |
| Dielectric window: ø30 PCD140 | 2000 | o | o | o | o | o | o | Δ | o | Δ | o |
|  | 2500 | o | o | o | o | o | o | o | o | Δ | o |
|  | 3000 | o | o | o | o | o | o | x | o | o | o |
| Dielectric window: ø20 PCD154 | 2000 |  |  | x | o | o | o | x | o | x | x |
|  | 2500 |  |  | o | o | o | o | x | x | o | o |
|  | 3000 |  |  | o | o | o | o | o | o | o | o |
| Dielectric Window only with First dielectric window Recess | 2000 | o | o | o | o | x | – | x | – | x | – |
|  | 2500 | Δ | o | o | o | o | o | x | – | x | – |
|  | 3000 | Δ | o | o | o | o | o | x | – | x | – |

Referring to Table 2, in a flow rate ratio of Ar/HBr, if a flow rate of HBr is relatively increased, plasma tends to become instable. In the conventional dielectric window shown in the bottommost part of Table 2, if the flow rate of HBr is equal to or higher than about 800 sccm, plasma stability is not obtained under any conditions. Meanwhile, in case of the dielectric window shown in FIG. 24, when the flow rate of HBr is equal to or higher than about 800 sccm, if a microwave power is increased, stable plasma can be generated under many various processing conditions. Further, in case of the dielectric window shown in FIG. 23, if the flow rate of HBr is relatively increased, there are still many processing conditions in which plasma is stabilized. Further, in case of the dielectric window shown in FIG. 3, except some processing conditions, stable plasma can be generated in most of the processing conditions. That is, under the above-specified conditions, a wider range of process margin can be obtained in the order of the dielectric window shown in FIG. 23, the dielectric window shown in FIG. 24 and the dielectric window shown in FIG. 3, according to Table 2.

Figure 25:
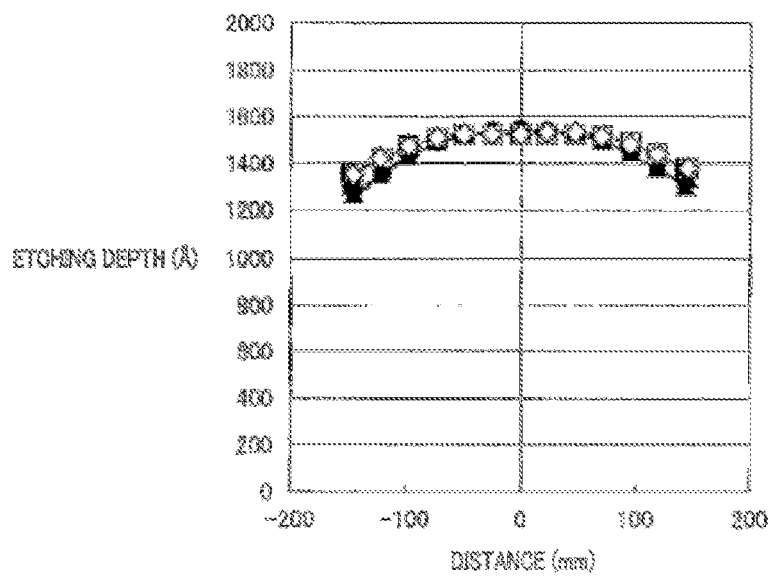
FIG. 25 is a graph showing a relationship between an etching depth and a distance from a center of a processing target substrate when an etching process is performed under a fifth processing condition in each of plasma processing apparatuses including dielectric windows shown in FIGS. 3 and 23.
Figure 26:
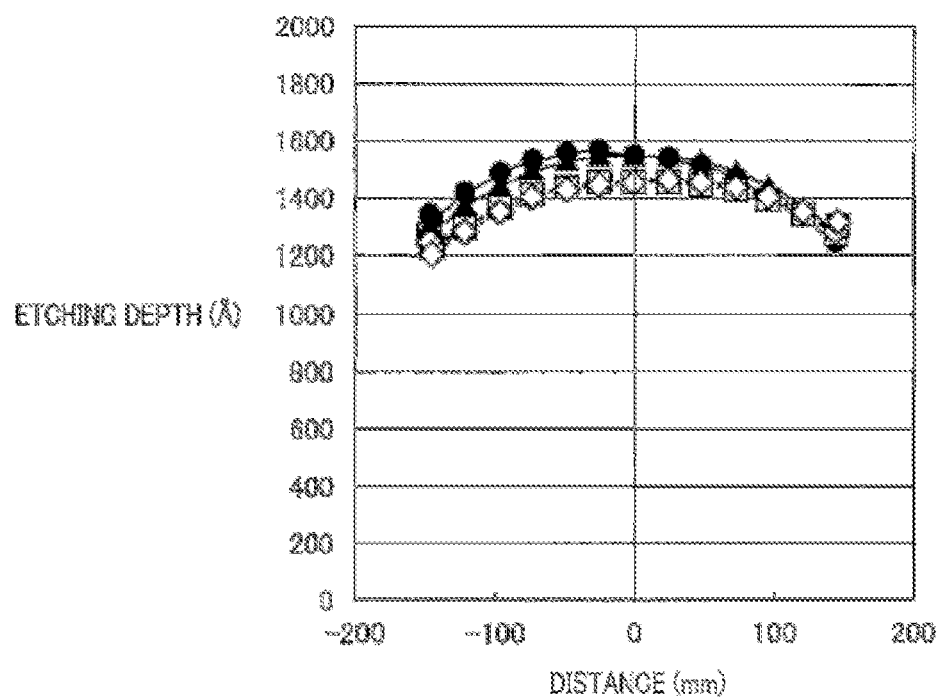
FIG. 26 is a graph showing a relationship between an etching depth and a distance from a center of a processing target substrate when an etching process is performed under a sixth processing condition in each of plasma processing apparatuses including dielectric windows shown in FIGS. 3 and 23.

Here, an etching depth in each of the dielectric windows shown in FIG. 3 and FIG. 23 are evaluated. FIG. 25 is a graph showing a relationship between an etching depth and a distance from a center of a processing target substrate when an etching process is performed in the plasma processing apparatus having the dielectric window of FIG. 3. FIG. 26 is a graph showing a relationship between an etching depth and a distance from a center of a processing target substrate when an etching process is performed in the plasma processing apparatus having the dielectric window of FIG. 23. In FIG. 25, the fifth processing condition in Table 1 is adopted as a processing condition. In FIG. 26, the sixth processing condition shown in Table 1 is adopted as a processing condition. In FIGS. 25 and 26, white rhombuses indicate Y-axial values when using the dielectric window shown in FIG. 23; white squares indicate X-axial values when using the dielectric window shown in FIG. 23; black triangles indicate Y-axial values when using the dielectric window shown in FIG. 3; and black circles indicate X-axial values when using the dielectric window shown in FIG. 3.

Referring to FIGS. 25 and 26, the shape of the graph when using the dielectric window of FIG. 23 is flat in a horizontal direction as compared to when using the dielectric window shown in FIG. 3. That is, in order to suppress a center first phenomenon, it is desirable to use the dielectric window shown in FIG. 23. That is, in the aspect of improving the processing uniformity in the diametrical direction, if the dielectric window shown in FIG. 23 is used, the center first tendency in the process can be reduced at least under the fifth and sixth processing conditions, so that the center first phenomenon can be reduced. Further, as described above, by configuring the gas supply unit to include the central gas supply unit and the outer gas supply unit, the processing uniformity in the diametrical direction can be finely controlled by adjusting the flow rate ratio between the gases. That is, herein, the center first phenomenon can be further ameliorated.

Moreover, in accordance with the above-described illustrative embodiments, the total number of the second dielectric window recesses is seven. However, the illustrative embodiments are not limited thereto, and the total number of the second dielectric window recesses may be, e.g., six or eight. The number and the size of the second dielectric window recesses and their positions in the diametrical direction of the dielectric window may be selected depending on the range of the required process margin or the configuration of the employed slot antenna plate. Furthermore, a multiple number of second dielectric window recesses may be formed in the diametrical direction of the dielectric window. That is, the second dielectric window recesses may be arranged such that their centers lie on two concentric circles of which centers in the diametrical direction are coincident.

Further, in the above-described illustrative embodiments, each second dielectric window recess has a circular hole shape. However, the shape of the second dielectric window recess may not be limited thereto but may be, e.g., a long hole or oval shape elongated in the circumferential direction or the diametrical direction of the dielectric window. Alternatively, the second dielectric window recess may have a polygonal shape such as a rectangle or a triangle. Moreover, although the second dielectric window recess has been described to be recessed straightly, the illustrative embodiment is not limited thereto. By way of example, the second dielectric window recess may be formed to have an inclined surface forming a tapered surface or to have a curved surface.

In addition, the illustrative embodiment has been described for the etching process. However, the illustrative embodiment may also be applicable to a CVD process, a plasma oxidation process, a plasma nitrification process, a plasma doping process, and so forth.

Moreover, although a RLSA is employed in above-described illustrative embodiment, the illustrative embodiment may not be limited thereto and may also be applicable to various microwave plasma processing apparatuses using microwave as a plasma source.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

INDUSTRIAL APPLICABILITY

The dielectric window for use in the plasma processing apparatus and the plasma processing apparatus have a wide range of process margin and may be used effectively when processing uniformity is required under a low pressure condition.

Further, the method for mounting the dielectric window for the plasma processing apparatus in accordance with the illustrative embodiment may be effectively used when it is required to mount the dielectric window easily and securely.

EXPLANATION OF CODES

11: Plasma processing apparatus
12: Processing chamber
13: Gas supply unit
14: Holding table
15: Microwave generator
16: Waveguide
17: Coaxial waveguide
18: Dielectric plate
19a: Bottom
19b: Sidewall
19c: Annular member
19d: End surface
19e: O-ring groove
20: Exhaust hole
21: O-ring
22a: Central conductor
22b: Outer conductor
23, 25: Gas supply opening
24: Central gas supply unit
26: Outer gas supply unit
27: Hollow member
28: Supporting member
29: Tuner
30: Mode converter
30a, 30b, 68a, 68b: Wall portion
30c, 30d, 68c, 68d: End portion
31, 66: Slot antenna plate
32, 33, 34, 67: Slot
35: Inner slot pair group
36: Outer slot pair group
37, 42: Through hole
38, 44a, 56, 57a, 57b, 57c, 57d, 57e, 57f, 57g, 61: Center
39: Reference hole
40: Slot pair
41, 71, 76: Dielectric window
43: Recess
45: Injector
46: Bottom surface
47, 72, 77: First dielectric window recess
48: Inner tapered surface
49, 52, 55: Flat surface
50: Outer tapered surface
53a, 53b, 53c, 53d, 53e, 53f, 53g, 73, 78: Second dielectric window recess
54: Cylindrical surface
58: Circle
59: Top surface
60: Dielectric window graduations
62, 63: Imaginary line
64: Circumferential end portion
65a, 65b, 65c: Region

What is claimed is:

1. A plasma processing apparatus using microwave as a plasma source, the plasma processing apparatus comprising:
   a dielectric window for the plasma processing apparatus, the dielectric window having a substantially circular plate shape and propagating the microwave,
   wherein a first dielectric window recess is formed on an outer region of a surface of the dielectric window in a diametrical direction of the dielectric window at a side where plasma is generated when the dielectric window is mounted in the plasma processing apparatus, the first dielectric window recess is extended in a ring shape and has a tapered shape inwardly in a thickness direction of the dielectric window, and the first dielectric window recess includes an inner tapered surface which is inclined in an upward and outward direction of the dielectric window and an outer tapered surface which is inclined in a downward and outward direction of the dielectric window,
   the first dielectric window recess is formed at a region of the dielectric window where a gas does not pass through,
   a plurality of second dielectric window recesses are formed between a center of the dielectric window and the first dielectric window recess, and each of the second dielectric window recesses is recessed inwardly in the thickness direction of the dielectric window from the surface of the dielectric window, and
   the second dielectric window recesses are arranged at a regular interval in a circumferential direction of the dielectric window to have rotation symmetry about the center of the dielectric window in the diametrical direction thereof.

2. The plasma processing apparatus of claim 1, further comprising:
   a substantially circular plate-shaped slot antenna plate,
   wherein the slot antenna plate has a plurality of slots formed through the slot antenna plate in a thickness direction of the slot antenna plate, and wherein the slot antenna plate is disposed above the dielectric window and is configured to radiate the microwave toward the dielectric window.

3. The plasma processing apparatus of claim 2,
   wherein the slot antenna plate has a plurality of slot pairs, each having:
   a first slot located at a central portion of the slot antenna plate and extended in one direction, and
   a second slot extended in a direction orthogonal to the one direction, and
   wherein at least a part of the first slot is overlapped with the second dielectric window recess.

4. The plasma processing apparatus of claim 2,
   wherein the slot antenna plate has a plurality of slot pairs each having a first slot extended in one direction and a second slot extended in a direction orthogonal to the one direction, and
   wherein, when viewed from the thickness direction of the slot antenna plate, the second dielectric window recess is located in a region where a region having a width equal to a long side of the first slot of the slot antenna plate and a region having a width equal to a long side of the second slot thereof overlap.

5. The plasma processing apparatus of claim 2,
wherein the slot antenna plate has a plurality of slot pairs, each having a first slot extended in one direction and a second slot extended in a direction orthogonal to the one direction, and
wherein each of the slot pairs is located at a position corresponding to a position where each of the second dielectric window recesses is formed.

6. The plasma processing apparatus of claim 2, further comprising:
a position adjusting device configured to:
adjust a position of the dielectric window in the circumferential direction of the dielectric window when the dielectric window is mounted in the plasma processing apparatus, and
adjust a relative position between the dielectric window and the slot antenna plate in the circumferential direction thereof.

7. The plasma processing apparatus of claim 2,
wherein a ratio of a short side length of the slot to a long side length thereof is equal to or larger than about ¼ and smaller than about 1.

8. A dielectric window for a plasma processing apparatus, the dielectric window being provided in the plasma processing apparatus using microwave as a plasma source, and having a substantially circular plate shape and propagating the microwave,
wherein a first dielectric window recess is formed on an outer region of a surface of the dielectric window in a diametrical direction of the dielectric window at a side where plasma is generated when the dielectric window is mounted in the plasma processing apparatus, the first dielectric window recess is extended in a ring shape and has a tapered shape inwardly in a thickness direction of the dielectric window, and the first dielectric window recess includes an inner tapered surface which is inclined in an upward and outward direction of the dielectric window and an outer tapered surface which is inclined in a downward and outward direction of the dielectric window,
the first dielectric window recess is formed at a region of the dielectric window where a gas does not pass through,
a plurality of second dielectric window recesses are formed between a center of the dielectric window and the first dielectric window recess, and each of the second dielectric window recess is recessed inwardly in the thickness direction of the dielectric window from the surface of the dielectric window, and
the second dielectric window recesses are arranged at a regular interval in a circumferential direction of the dielectric window to have rotation symmetry about the center of the dielectric window in the diametrical direction thereof.

9. The dielectric window of claim 8,
wherein the second dielectric window recess is recessed inwardly and straightly in the thickness direction of the dielectric window from the surface of the dielectric window at the side where plasma is generated.

10. The dielectric window of claim 8,
wherein the second dielectric window recess has a circular hole shape when viewed from the thickness direction of the dielectric window.

11. The dielectric window of claim 10,
Wherein, when viewed from the thickness direction of the dielectric window, centers of the second dielectric window recesses, each having the circular hole shape, are arranged on a circle centered about the center of the dielectric window in the diametrical direction thereof.

12. The dielectric window of claim 8, further comprising:
a position adjusting device configured to adjust a position of the dielectric window in the circumferential direction of the dielectric window when the dielectric window is mounted in the plasma processing apparatus.

13. The dielectric window of claim 12,
wherein the position adjusting device includes dielectric window graduations provided between the first dielectric window recess and an edge portion of the dielectric window.

14. A method for mounting a dielectric window for a plasma processing apparatus in the plasma processing apparatus using microwave as a plasma source, the dielectric window having a substantially circular plate shape and propagating the microwave,
wherein, in the dielectric window, a first dielectric window recess is formed on an outer region of a surface of the dielectric window in a diametrical direction of the dielectric window at a side where plasma is generated when the dielectric window is mounted in the plasma processing apparatus, and the first dielectric window recess is extended in a ring shape and has a tapered shape inwardly in a thickness direction of the dielectric window,
wherein a plurality of second dielectric window recesses are formed between a center of the dielectric window and the first dielectric window recess, and each of the second dielectric window recesses is recessed inwardly in the thickness direction of the dielectric window from the surface of the dielectric window,
wherein the second dielectric window recesses are arranged at a regular interval in a circumferential direction of the dielectric window to have rotation symmetry about the center of the dielectric window in the diametrical direction thereof, and
wherein the plasma processing apparatus includes a substantially circular plate-shaped slot antenna plate, and the slot antenna plate has a plurality of slots formed through the slot antenna plate in a thickness direction thereof, and the slot antenna plate is disposed above the dielectric window and radiates the microwave toward the dielectric window, and
the method comprises:
adjusting a positional relationship between the second dielectric window recesses of the dielectric window and the slots of the slot antenna plate in the circumferential direction when mounting the dielectric window in the plasma processing apparatus.

15. The method of claim 14,
wherein dielectric window graduations for adjusting a position of the dielectric window in the circumferential direction thereof is provided at the dielectric window,
wherein a mark as a reference for a position in the circumferential direction of the slot antenna plate is provided at the slot antenna plate, and
wherein the positional relationship between the dielectric window and the slot antenna plate in the circumferential direction is adjusted by using the dielectric window graduations and the mark.

* * * * *